United States Patent [19]

Hyatt

[11] 4,342,906
[45] Aug. 3, 1982

[54] PULSE WIDTH MODULATED FEEDBACK ARRANGEMENT FOR ILLUMINATION CONTROL

[76] Inventor: Gilbert P. Hyatt, P.O. Box 4584, Anaheim, Calif. 92803

[21] Appl. No.: 874,446

[22] Filed: Feb. 2, 1978

Related U.S. Application Data

[63] Continuation of Ser. No. 727,330, Sep. 27, 1976, abandoned, which is a continuation-in-part of Ser. No. 366,714, Jun. 4, 1973, Pat. No. 3,986,022.

[51] Int. Cl.³ .............................................. G01J 1/32
[52] U.S. Cl. ................................................ 250/205
[58] Field of Search ............... 250/205; 315/151, 156, 315/158; 364/104, 105, 107, 117, 118

[56] References Cited

U.S. PATENT DOCUMENTS

| | | |
|---|---|---|
| 3,427,458 | 2/1969 | Darfomak et al. ................... 250/205 |
| 3,473,084 | 10/1969 | Dodge .................................. 315/151 |
| 3,558,892 | 1/1971 | Seeley ................................... 315/151 |
| 3,670,202 | 6/1972 | Paine et al. ........................... 315/158 |
| 3,696,344 | 10/1972 | Feinleib et al. ...................... 250/205 |
| 3,705,758 | 12/1972 | Haskal ................................ 331/94.5 |
| 3,713,042 | 1/1973 | Kinsel .................................. 350/160 |
| 3,720,923 | 3/1973 | Chen et al. ........................... 350/160 |
| 3,727,527 | 4/1973 | Borkowski et al. ................. 350/331 |
| 3,744,906 | 7/1973 | Sato et al. ............................ 250/205 |
| 3,748,753 | 7/1973 | Whitcomb et al. ................. 350/331 |
| 3,764,213 | 10/1973 | O'Meara ................................ 356/5 |
| 3,770,961 | 11/1973 | Westell ................................. 350/331 |
| 3,778,791 | 12/1973 | Lewicki et al. ...................... 250/205 |
| 3,778,791 | 12/1973 | Lewicki et al. ...................... 250/205 |
| 3,790,901 | 2/1974 | White et al. ......................... 250/199 |
| 3,815,982 | 6/1974 | Wagensonner ..................... 350/331 |
| 3,844,650 | 10/1974 | Nicholson et al. ................. 350/331 |
| 3,898,007 | 8/1975 | Wiklund ............................. 250/205 |
| 3,989,356 | 11/1976 | Altman . | |

Primary Examiner—David C. Nelms
Attorney, Agent, or Firm—Gilbert P. Hyatt

[57] ABSTRACT

Illumination amplifier devices such as liquid crystal devices (LCDs) are controlled with feedback servo arrangements using pulse modulated signals such as pulse width modulated signals or using proportional analog signals. In a preferred embodiment, illumination is controlled with an LCD, where the controlled illumination is monitored with a electro-optical sensor to generate a feedback signal related to a characteristic of the controlled illumination. The feedback signal is processed with an illumination servo to provide a control signal to the LCD for precisely controlling illumination with the LCD. A pulse modulation circuit provides pulse modulation signals to control the LCD, thereby providing a form of proportional control with signals that provide on-off type characteristics. This arrangement provides more precise control for illumination amplifiers and provides proportional control with the illumination amplifier operating in an on-off manner.

35 Claims, 36 Drawing Figures

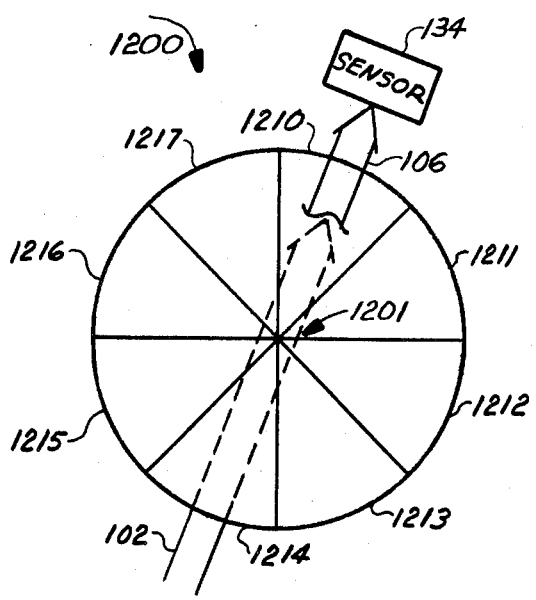
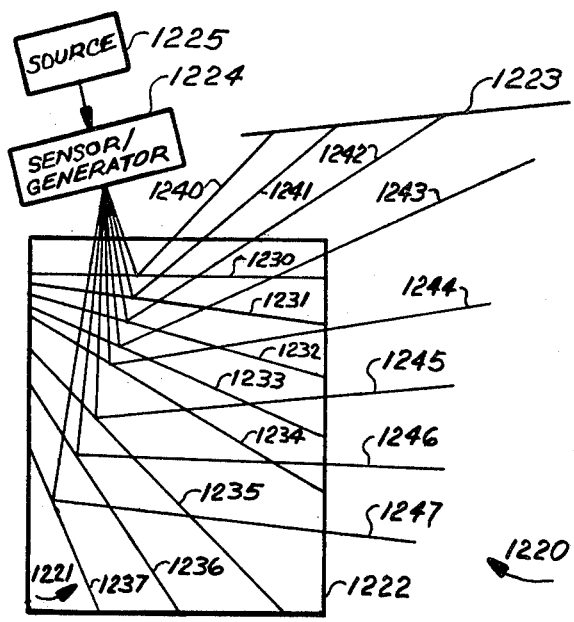
FIG 12A  FIG 12B
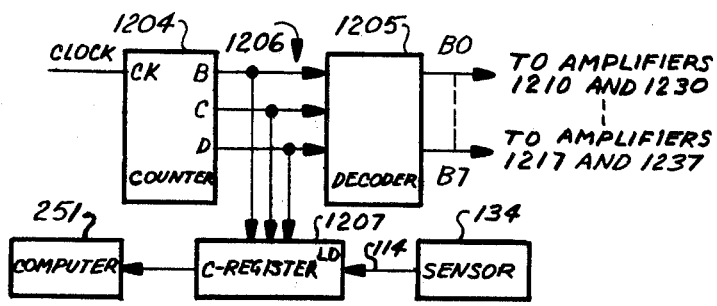
FIG 12C
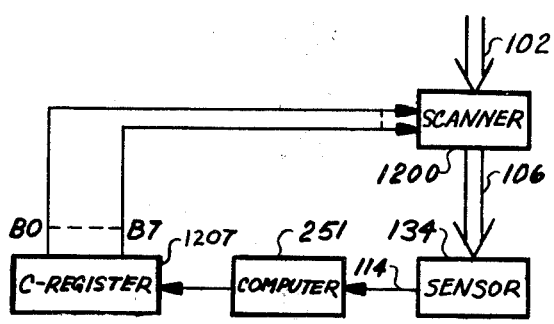
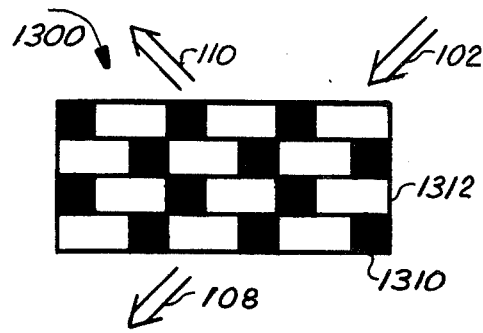
FIG 12D  FIG 13

PULSE WIDTH MODULATED FEEDBACK ARRANGEMENT FOR ILLUMINATION CONTROL

CROSS REFERENCE TO RELATED APPLICATIONS

The instant application is a continuation of copending parent application Illumination Signal Processing System Ser. No. 727,330 filed on Sept. 27, 1976 now abandoned in favor of continuing applications by Gilbert P. Hyatt and is further a continuation in part of issued grandparent application Illumination Control System Ser. No. 366,714 filed on June 4, 1973 by Gilbert P. Hyatt now U.S. Pat. No. 3,986,022 issued on Oct. 12, 1976 which was copending with said parent application wherein said copending parent application and said issued grandparent application are herein incorporated by reference as if fully set forth at length herein and wherein the benefit of the filing dates of said copending parent application and said issued grandparent application are herein claimed in accordance with the U.S. Code such as with 35 USC 120 and 35 USC 121.

Further, the instant application is related to copending applications
  (1) Factored Data Processing System For Dedicated Applications Ser. No. 101,881 filed on Dec. 28, 1970 by Gilbert P. Hyatt now abandoned in favor of continuing applications;
  (2) Control System And Method Ser. No. 134,958 filed on Apr. 19, 1971 by Gilbert P. Hyatt;
  (3) Control Apparatus Ser. No. 135,040 filed on Apr. 19, 1971 by Gilbert P. Hyatt;
  (4) Computerized System For Operator Interaction Ser. No. 288,247 filed on Sept. 11, 1972 by Gilbert P. Hyatt now U.S. Pat. No. 4,016,540 issued on Apr. 5, 1977;
  (5) A System For Interfacing A Computer To A Machine Ser. No. 291,394 filed on Sept. 22, 1972 by Gilbert P. Hyatt;
  (6) Digital Arrangement For Processing Squarewave Signals Ser. No. 302,771 filed on Nov. 1, 1972 by Gilbert P. Hyatt;
  (7) Apparatus And Method For Providing Interactive Audio Communication Ser. No. 325,933 filed on Jan. 22, 1973 by Gilbert P. Hyatt; and
  (8) Method And Apparatus For Signal Enhancement With Improved Digital Filtering Ser. No. 550,231 filed on Feb. 13, 1975 by Gilbert P. Hyatt now U.S. Pat. No. 4,209,843 issued on June 24, 1980
wherein these copending applications are herein incorporated by reference as if fully set forth at length herein.

Still further, the instant application is related to issued patents
  (1) Adaptive Illumination Source Intensity Control Device Ser. No. 152,105 filed on June 11, 1971 by Barry T. Lee, Gunther W. Wimmer, and Gilbert P. Hyatt and now U.S. Pat. No. 3,738,242 issued on June 12, 1973;
  (2) Apparatus And Method For Producing High Registration Photo-Masks Ser. No. 229,213 filed on Apr. 13, 1972 by Gilbert P. Hyatt and now U.S. Pat. No. 3,820,894 issued on June 28, 1974;
  (3) Adaptive Illumination Control Device Ser. No. 325,792 filed on Jan. 22, 1973 by Barry T. Lee, Gunther W. Wimmer and Gilbert P. Hyatt and now U.S. Pat. No. 3,927,411 issued on Dec. 16, 1975; and
  (4) Illumination Control System Ser. No. 327,918 filed on Jan. 30, 1973 by Barry T. Lee, Gunther W. Wimmer, and Gilbert P. Hyatt and now U.S. Pat. No. 3,818,496 issued on June 18, 1974
wherein these patents were copending with parent application Ser. No. 366,714 and are therein incorporated by reference and are further incorporated by reference herein as if fully set forth at length herein.

BACKGROUND OF THE INVENTION

1. Field of the Invention

This invention relates to illumination control systems and, in particular, feedback control and pulse modulated control of illumination amplifiers.

2. Description of the Prior Art

Control of illumination has been accomplished in the prior art with mechanical devices. The well known aperture and shutter of a camera are common mechanical devices for controlling light. Other prior art illumination control arrangements are described hereafter.

In the photoplotter field, a photohead is used to control light for exposing film. Mechanically positioned filters and shutters are used for illumination control such as described in U.S. Pat. No. 3,330,182 issued in July 1967.

In the construction field; mechanical devices such as shutters, louvres, shades, and awnings are used to control natural illumination. These devices may be fixed or mechanically controlled, but are not provided with electronic control capability.

In the computer field, electronic computers are in wide scale use. Illumination signals must be converted to electronic form for processing in prior art systems because of the absence of illumination computer devices for processing illumination signals.

In the display field, liquid crystal displays require external light, either dependent on ambient light or using light bulbs. Integral illumination sources have not been available for such displays.

Liquid crystal displays provide only fully on or fully off conditions, but do not provide analog or proportional control. Limitations of on-off control arrangements have severly limited applicability of liquid crystal devices. Also, because servo control is related to proportional control, servo control of illumination has not been feasible.

The prior art in illumination control is further defined in the art-of-record of the parent application Ser. No. 366,714 including U.S. Pat. Nos. 3,790,901 to White et al.; 3,778,791 to Lewicki et al.; 3,764,213 to O'Meara; 3,744,906 to Sato et al.; 3,720,923 to Chen et al.; 3,713,042 to Kinsel; 3,705,758 to Haskal; 3,696,344 to Feinleib et al.; 3,670,202 to Paine et al.; 3,558,892 to Seeley; 3,473,084 to Dodge; and 3,427,458 to Parfomak et al. which are herein incorporated-by-reference. The prior art in illumination control is still further defined in the art-of-record of the referenced related applications including U.S. Pat. Nos. 3,836,916 to Wiley; 3,721,164 to Kuttigen; 3,703,858 to Canfora; 3,695,154 to Webster; 3,686,675 to Faul; 3,648,578 to Ritchie; 3,610,119 to Gerber; 3,595,147 to Blattner; 3,565,524 to Pabst et al.; 3,498,711 to Ables et al.; 3,458,253 to Hansen; 3,354,806 to DeLang et al.; 3,330,182 to Gerber et al.; 3,323,414 to Ritchie et al.; and 3,048,093 to Loro which are herein incorporated-by-reference.

SUMMARY OF THE INVENTION

The present invention provides an illumination control system for improved control of illumination. This illumination control system uses substantially all solid state devices for electronic control of illumination, with reduced dependence on mechanical control devices.

Illumination amplifiers are provided which control the transmissivity-reflectivity characteristic as a function of applied excitation. Such amplifier devices may be controlled in a digital fashion or in an analog fashion using electronic signals for control of illumination. Also, servo arrangements are provided for precise control of illumination.

Availability of a basic illumination processing component, the illumination amplifier, permits a wide variety of illumination processing systems to be implemented. These systems include illumination computers of both the digital and the analog variety, photographic cameras, photoplotter systems, illumination controls for vehicles such as automobiles, light and heat control systems for inhabited structures, and other such illumination systems.

Various control configurations may be provided including open and closed loop controls, analog and digital controls, illumination amplifier excitation arrangements, and other control configurations. In a preferred embodiment, a feedback arrangement is provided for illumination control. A pulse width modulated circuit provides pulse width control of the illumination amplifier.

An object of this invention is to provided an improved illumination control system.

A further object of this invention is to provide a solid state illumination control system.

A still further object of this invention is to provide an illumination control system for an inhabited structure.

Yet a further object of this invention is to provide illumination computer arrangements including both analog and digital illumination arrangements.

Another object of this invention is to provide improved excitation and control devices for illumination amplifier arrangements.

Yet another object of this invention is to provide illumination closed loop servos for precision control.

A further object of this invention is to provide pulse modulated control of illumination.

Still a further object of this invention is to provide an improved display arrangement.

Yet another object of this invention is to provide an improved illuminated switch arrangement.

The foregoing and other objects, features, and advantages of this invention will become apparent from the following detailed description of preferred embodiments of this invention, as illustrated in the accompanying drawings.

BRIEF DESCRIPTIONS OF THE DRAWINGS

A better understanding of the invention may be had from a consideration of the following detailed description taken in conjunction with the following drawings, in which.

Figure 3A:
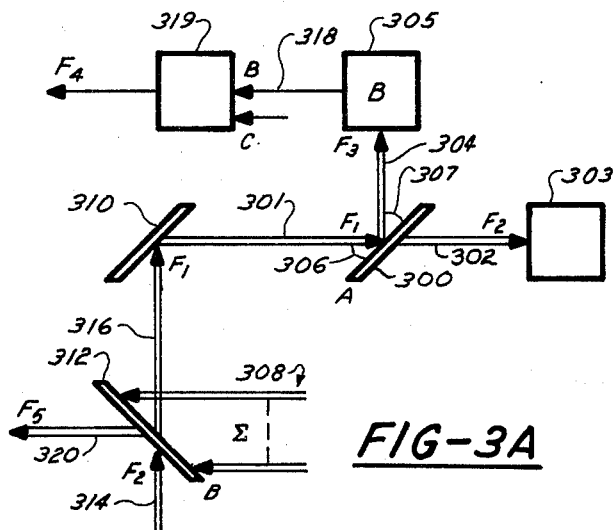
Figure 3B:
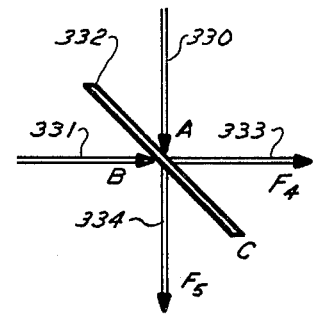
Figure 3C:
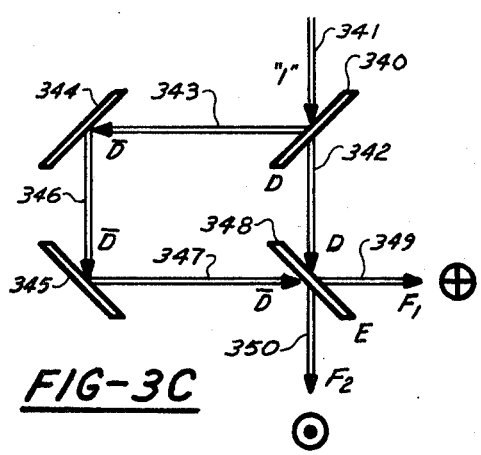
Figure 3D:
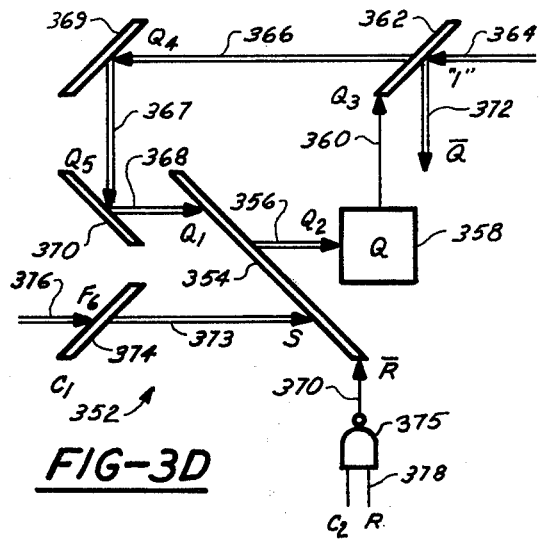
Figure 3E:
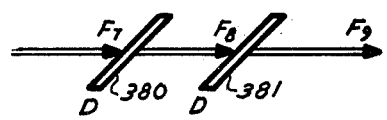
Figure 3F:
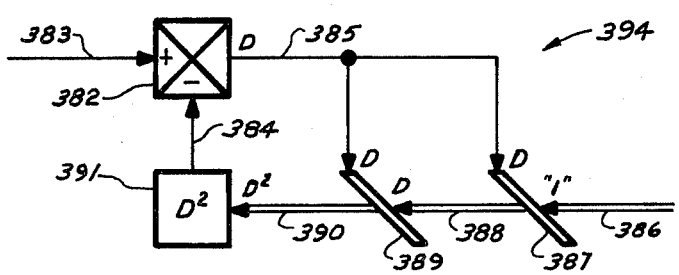

FIGS. 3A-3F illustrate illumination arrangements in schematic and block diagram form comprising FIG. 3A showing a generalized control network, FIG. 3B showing operation of a single illumination amplifier, FIG. 3C showing an exclusive-OR and coincidence logical arrangement, FIG. 3D showing a flip-flop logical arrangement, FIG. 3E showing an analog exponential arrangement, and FIG. 3F showing an analog implicite servo arrangement.

Figure 4:
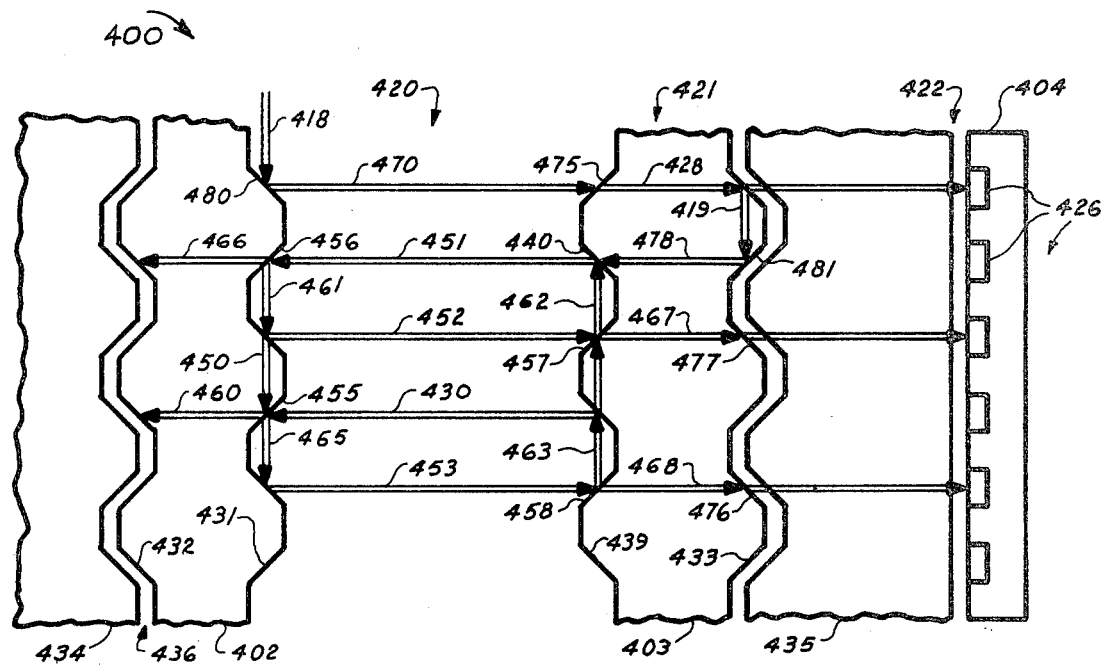

FIG. 4 is a schematic diagram of a batch fabricated illumination control arrangement.

Figure 5:
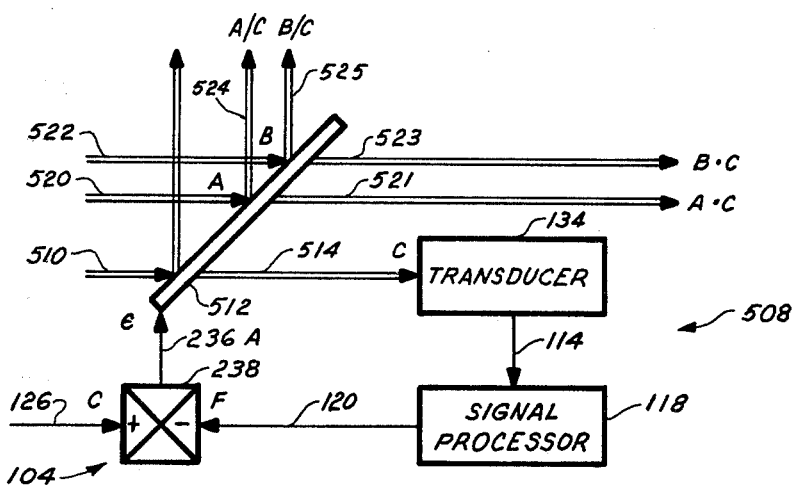

FIG. 5 is a schematic and block diagram illustrating a closed loop control for an illumination amplifier arrangement.

Figures 6A, 6B:
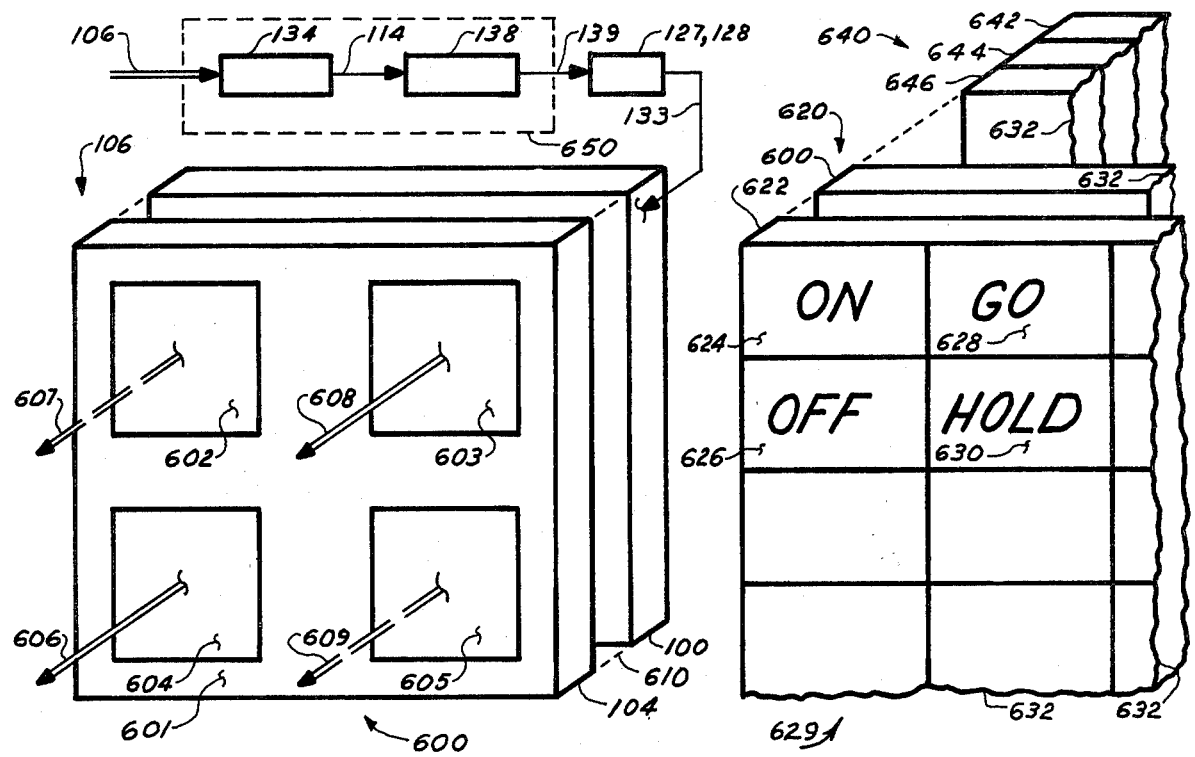
Figure 6C:
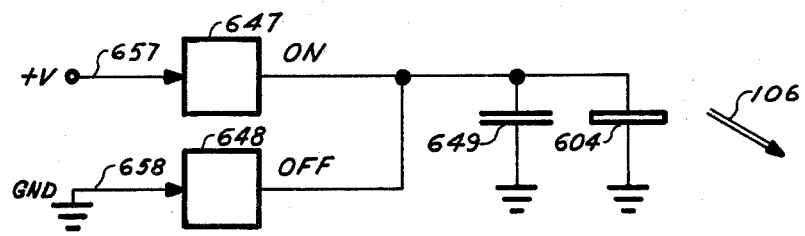
Figure 6D:
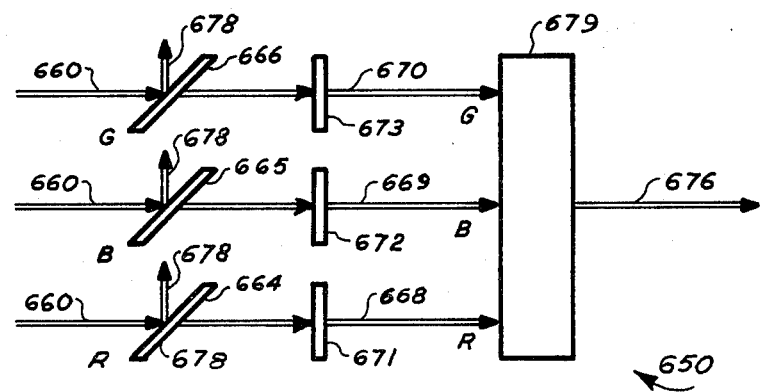
Figure 6E:
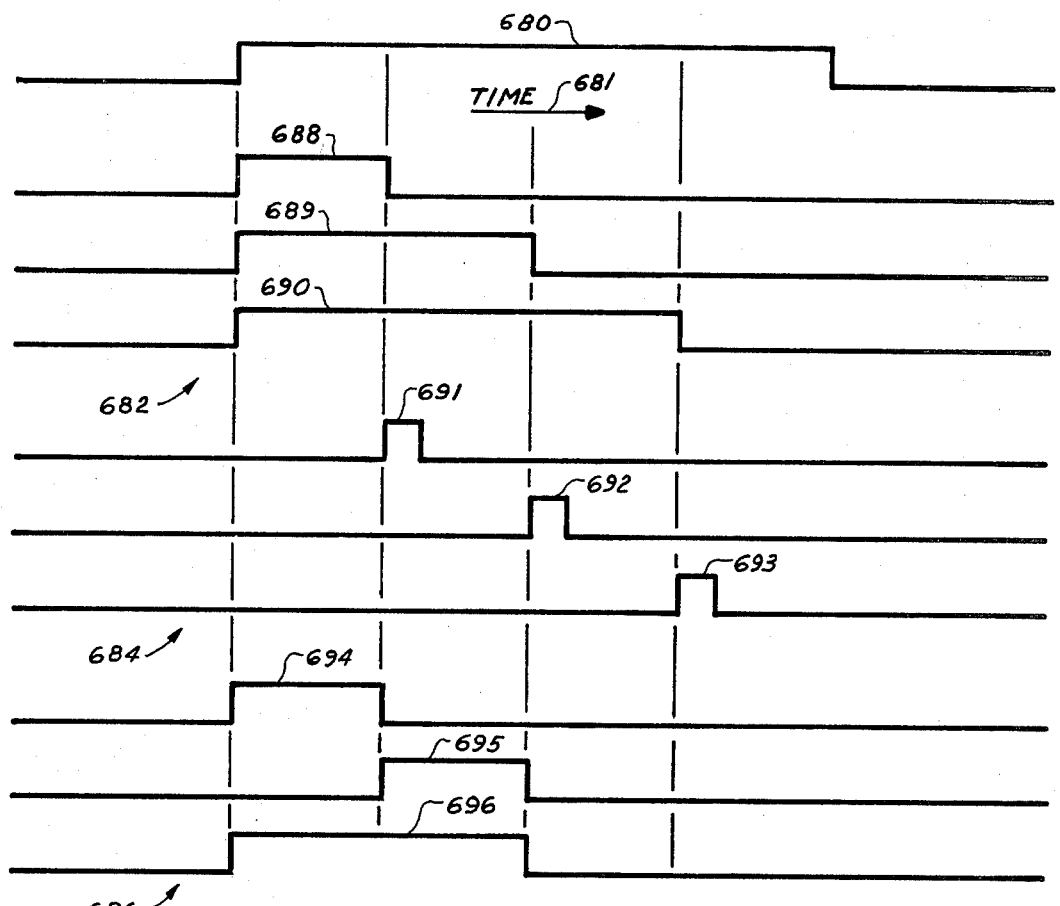

FIGS. 6A-6E illustrate display arrangements in schematic, waveform, and block diagram form comprising FIG. 6A showing a batch fabricated display arrangement, FIG. 6B showing a batch fabricated illuminated switch arrangement, FIG. 6C showing an illuminated switch schematic diagram, FIG. 6D showing a control arrangement for colored illumination, and FIG. 6E showing pulse modulation control waveforms.

Figure 7A:
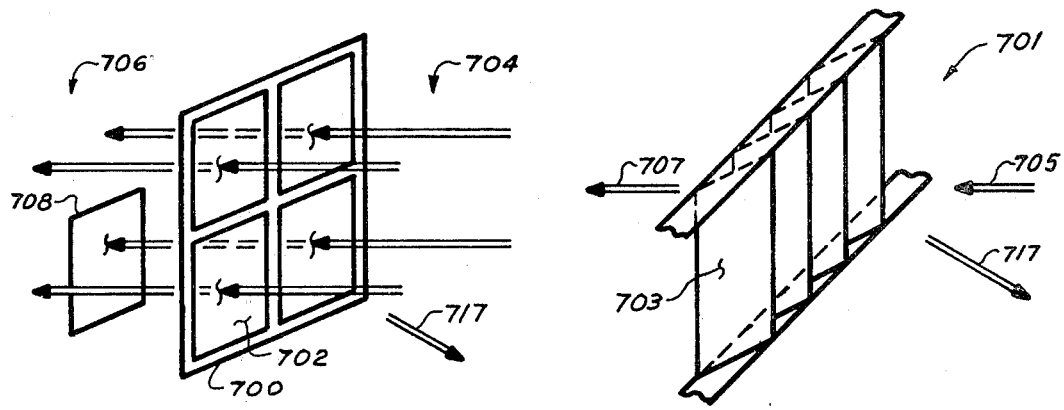
Figure 7B:
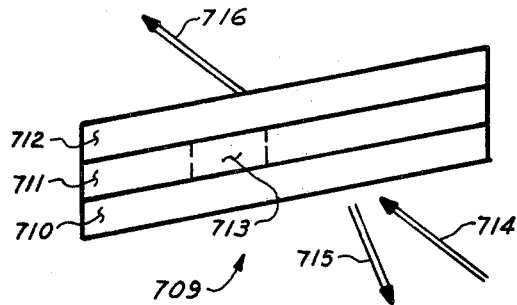
Figure 7C:
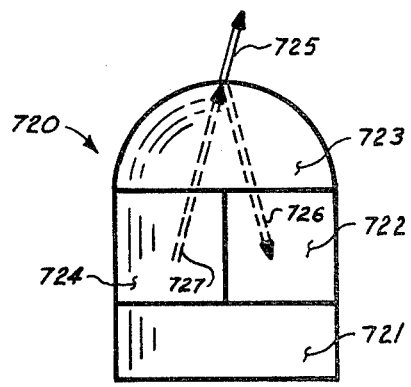
Figure 7D:
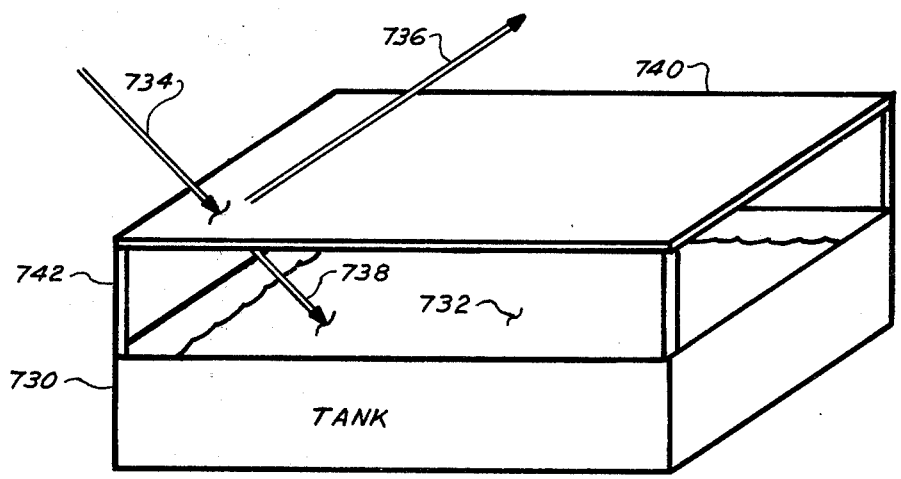

FIGS. 7A-7D are schematic and block diagrams illustrating illumination control arrangements for buildings and for vehicles comprising FIG. 7A showing a first window and a louver illumination control arrangement, FIG. 7B showing a second window illumination control arrangement, FIG. 7C showing an artificial illumination control arrangement, and FIG. 7D showing a temperature control arrangement.

Figure 8A:
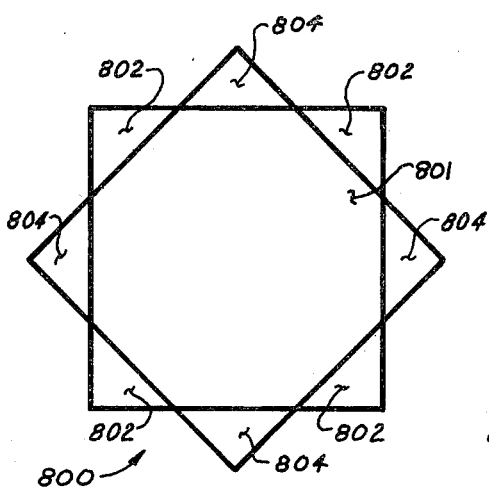
Figure 8B:
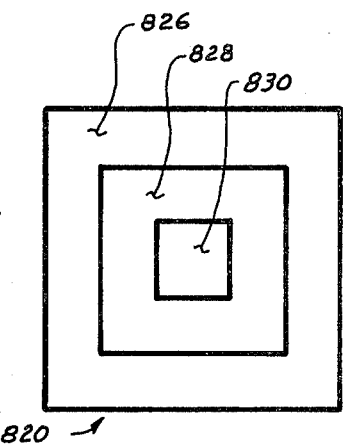
Figure 8C:
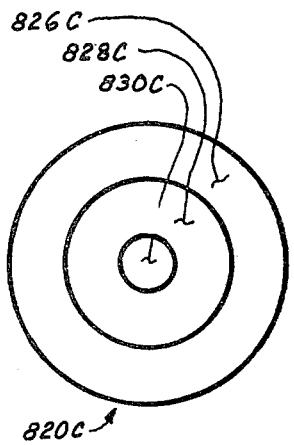
Figure 8D:
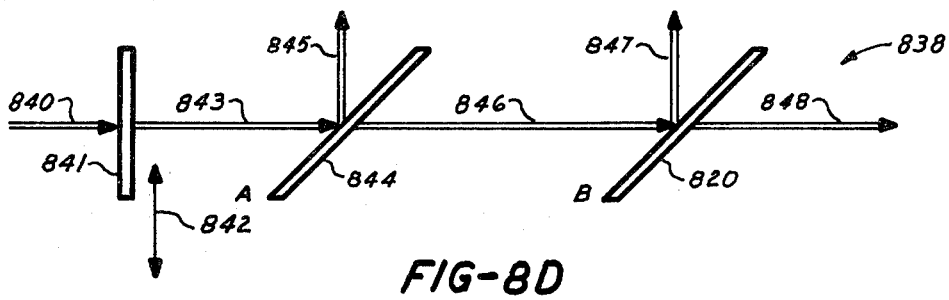

FIGS. 8A-8D are schematic and block diagrams illustrating illumination control arrangements for camera systems comprising FIG. 8A showing an image rotation arrangement, FIG. 8B showing a square aperture arrangement, FIG. 8C showing a circular aperture arrangement, and FIG. 8D showing an illumination control arrangement for a camera.

Figure 9A:
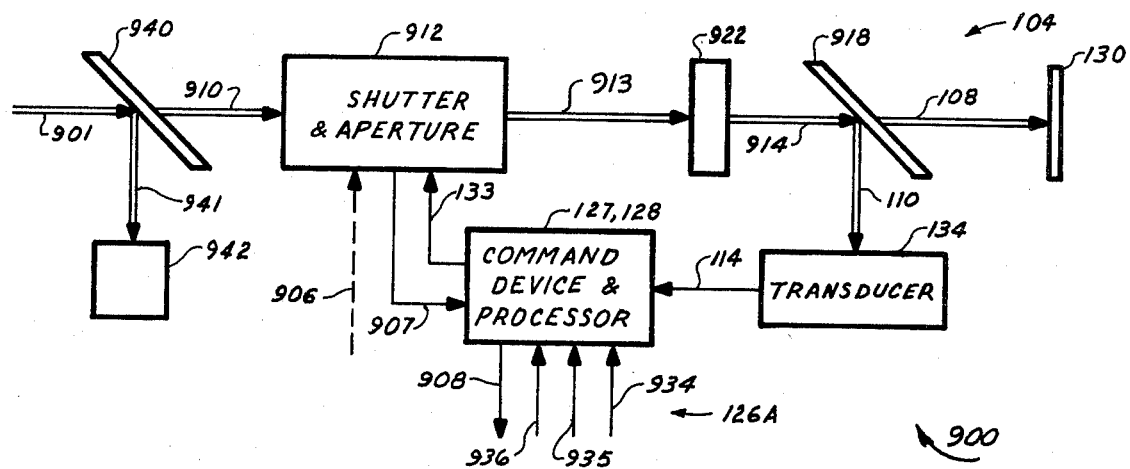
Figure 9B:
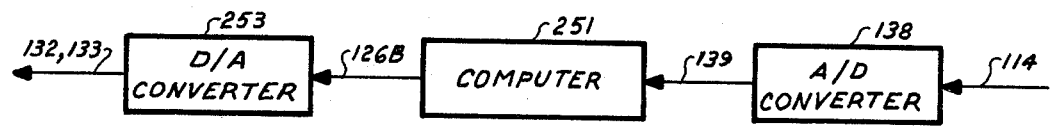
Figure 9C:
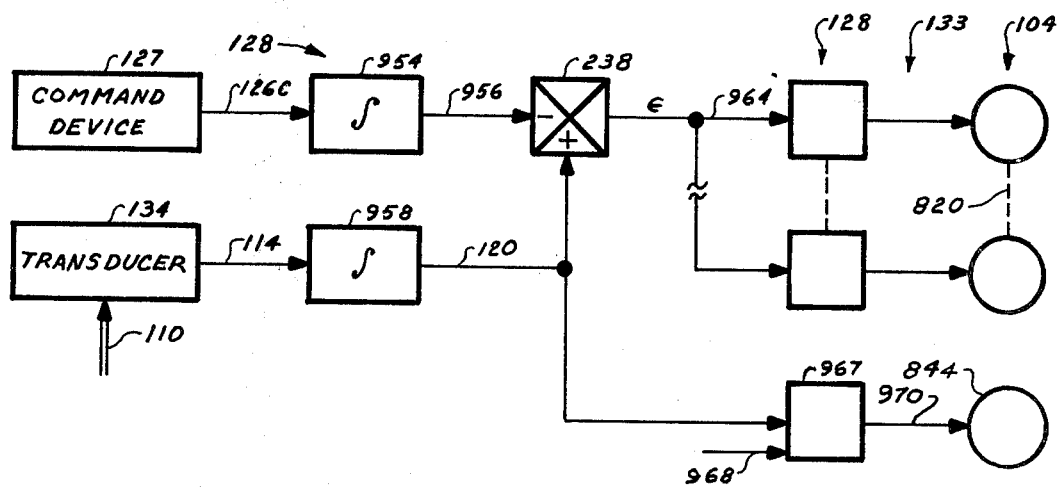

FIGS. 9A-9C are schematic and block diagrams illustrating a camera control system in accordance with the present invention comprising FIG. 9A showing a detailed camera control arrangement, FIG. 9B showing a computer control arrangement, and FIG. 9C showing a special purpose control arrangement.

Figure 10:
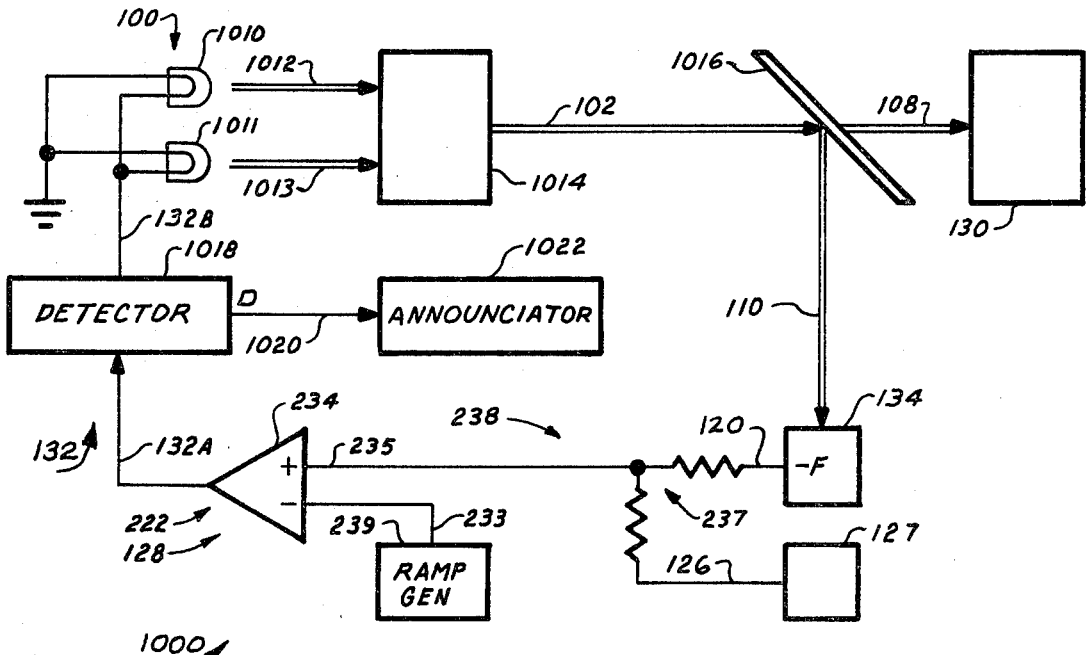

FIG. 10 is a schematic and block diagram illustrating a photoplotter system in accordance with the present invention.

Figure 11:
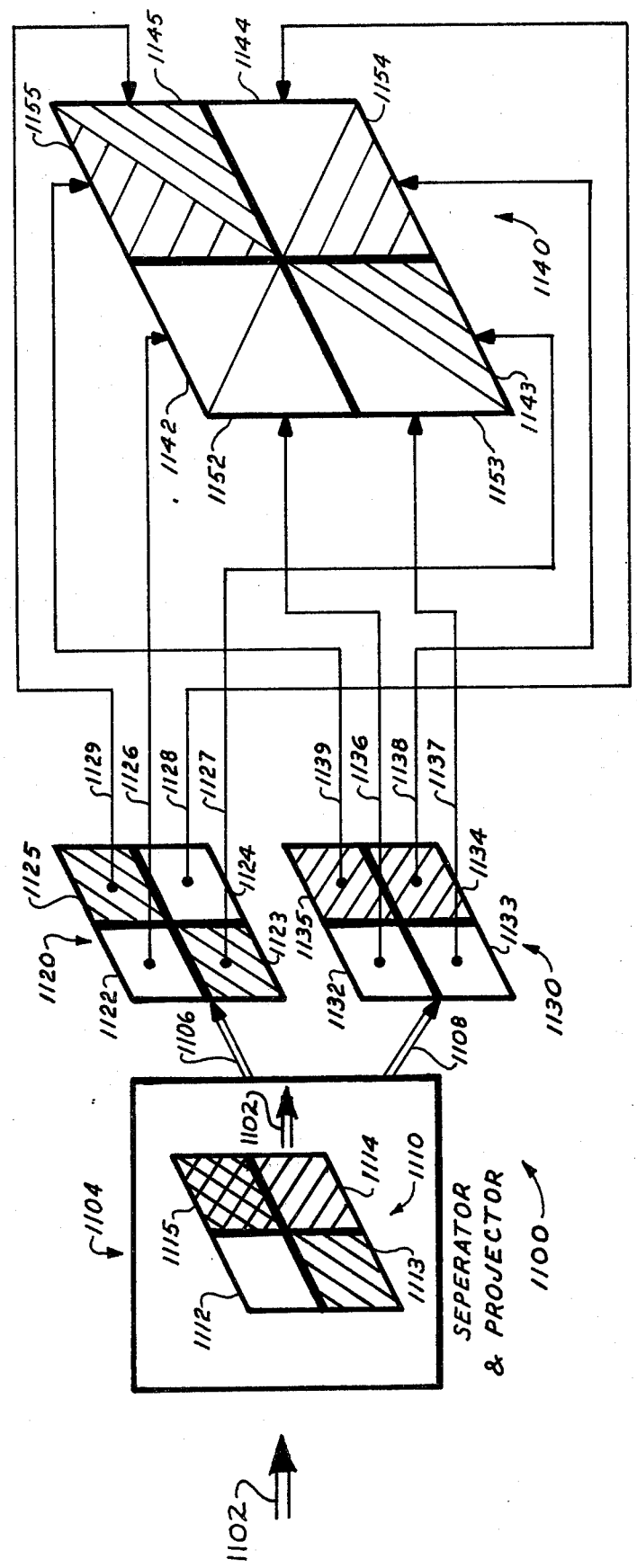

FIG. 11 is a schematic and block diagram illustrating a display system in accordance with the present invention.

FIGS. 12A-12D are schematic and block diagrams illustrating an illumination scanner, chopper, and modulator system in accordance with the present invention comprising FIG. 12A showing a first electro-optical embodiment, FIG. 12B showing a second electro-optical embodiment, FIG. 12C showing a first control embodiment, and FIG. 12D showing a second control embodiment.

FIG. 13 is a schematic and block diagram illustrating an interspersed array of electro-optical elements for illumination control.

Material pertinent to the figures has been cancelled and incorporated by reference from grandparent U.S. Pat. No. 3,986,022 at column 11 line 1 to column 55 line 27 therefrom.

By way of introduction of the illustrated embodiment, the components shown in FIGS. 1 through 13 of the drawings have been assigned general reference numerals and a brief description of such components is given in the following description. The components in each figure have in general been assigned three or four digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

The illumination control system of this invention can take any of a number of possible forms. Preferred embodiments of several features of the present invention are shown in the accompanying figures and will be described in detail hereafter.

Figure 1:
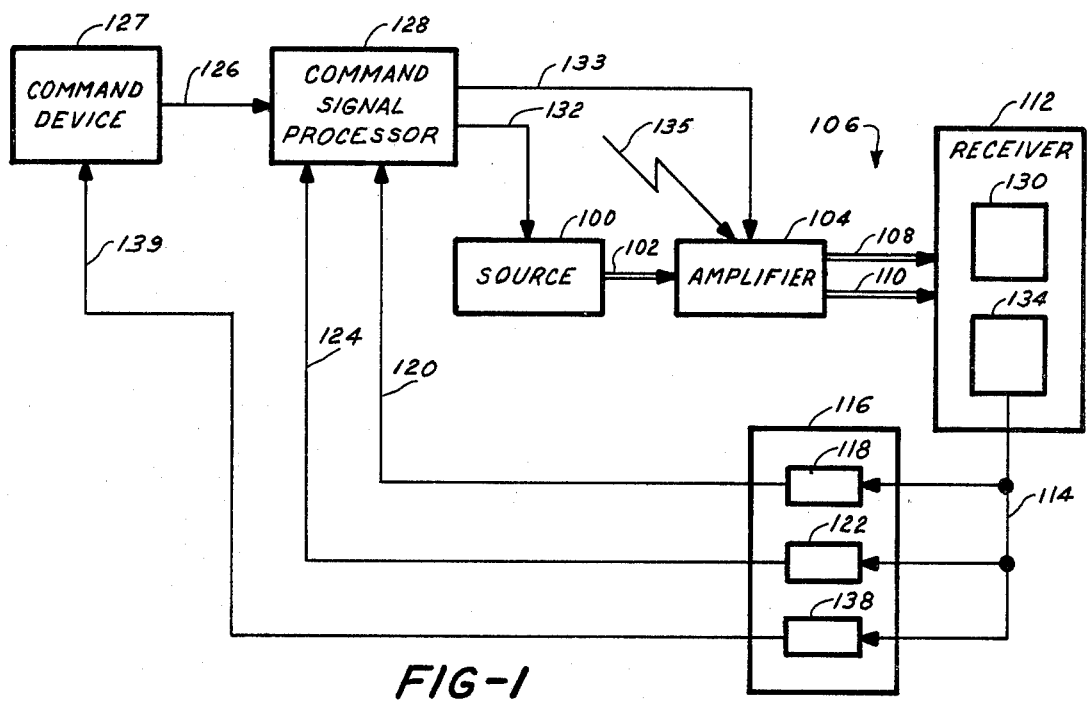
FIG. 1 is a block diagram of an illumination control arrangement in accordance with the present invention.

The system of this invention is exemplified by the simplified block diagram shown in FIG. 1. An illumination source 100 generates illumination 102 which is directed to an illumination amplifier 104. The illumination 102 from the source 100 may be defined as source illumination. Source illumination 102 may be raw illumination or may be controlled by source illumination control devices such as will be described hereafter. Illumination amplifier 104 may be a variable illumination transmissivity device such as a well known liquid crystal device. Controlled illumination 106 from illumination amplifier 104 is directed to illumination receiver 112. This controlled illumination 106 may be controlled by reflection, transmission, or by other characteristics of illumination amplifier 104. Also, controlled illumination 106 may comprise a plurality of illumination signals such as one or more reflected components and one or more transmitted components, where one of these illumination components 108 may perform a first illumination task such as exposing an illumination sensitive medium which may be receiver 130 and another of these illumination components 110 may perform a second illumination task such as illuminating an illumination sensitive feedback transducer which may be receiver 134. The illumination sensitive medium provides an illumination reaction in response to the illumination such as a chemical reaction in a photographic film medium or a thermal reaction in an illumination absorbing medium, wherein exposure of such mediums are discussed in detail hereinafter. One arrangement comprising control of a plurality of illumination signals will be discussed hereafter with reference to FIGS. 3, 4, and 5.

Illumination receiver 112 may include an arrangement for illuminating an illumination sensitive medium 130 such as a film and may include a feedback transducer 134 for providing feedback signal 114 for control of illumination.

Illumination feedback signals 114 may be used to control illumination amplifiers 104, may be used to control illumination sources 100 and may be used as feedback to command devices 127. Feedback signal processor 116 provides signal processing for feedback signals 114 and may include illumination amplifier feedback signal processor 118 for generating an illumination amplifier feedback signal 120 for control of illumination 106 by amplifiers 104 with processed command signals 133; may further include illumination source feedback signal processor 122 for generating illumination source feedback signals 124 for control of illumination 102 by source 100 with processed command signals 132; and may still further include illumination command device feedback signal processor 138 for generating illumination command device feedback signals 139 for control of command signals 126 by command devices 127.

Illumination command signal 126 may be open loop or closed loop input commands from command devices 127. Such a command device may be a manual device for operator control such as a switch arrangement or may be an automatic device such as a digital computer, an analog computer, or other such well known command arrangements. Command signal processor 128 may generate illumination source command signals 132 to command source 100 to generate source illumination 102; or may generate illumination amplifier command signals 133 to command amplifier 104 to control illumination 106; or both.

Illumination Amplifier Devices

An amplifier may be described as a device that permits a relatively large amount of energy to be controlled with a relatively small amount of control energy. An illumination amplifier is herein intended to mean a device that controls illumination with a control signal which may be a low energy electrical control signal in a preferred embodiment. Prior art illumination controls require high energy control signals to excite illumination sources such as incandescent lamps or to drive mechanical devices such as shutters. In a preferred embodiment, the system of this invention requires a low level electrical signal to excite an illumination amplifier such as a liquid crystal device for control of illumination.

Illumination amplifier arrangements are herein discussed relative to electrical excitation signals controlling the reflectivity-transmissivity characteristics of illumination amplifiers for control of illumination signals. Illumination amplifiers may also be controlled with other signals 135 such as temperature conditions for controlling the reflectivity-transmissivity characteristic of a temperature sensitive cholesteric liquid crystal device. Similarly, various control signals such as electrical and temperature signals 133 and 135 may be used to control other parameters of illumination such as combinations of reflectivity, transmissivity, absorption, refraction, and filtering of illumination.

It should be understood that an actual illumination device such as an illumination amplifier may not be a perfect reflector or transmitter of illumination and may absorb, transmit, and reflect a certain amount of illumination even when controlled to be fully transmissive or fully reflective. For simplicity in describing this invention, a perfect illumination amplifier will be assumed without absorbtion and with the ability to completely control reflectivity and transmissivity.

For simplicity of presentation, illumination amplifiers may be shown without electrodes, excitation and control arrangements. The electrical excitation can be provided with well known arrangements and may not be discussed in detail herein. Illumination amplifiers discussed and illustrated herein are intended to include suitable electrode and excitation arrangements even though these electrode and excitation arrangements may not be specifically illustrated.

This invention relates to illumination amplifiers which may include electro-optical and electro-chemical devices exemplified with liquid crystal devices for controlling illumination with electrical signals. In order to exemplify the teachings of this invention, arrangements may be described using illumination amplifiers such as the well known liquid crystal panels.

Liquid crystal devices may be used to exemplify features of this invention. Liquid crystal devices are well known in the art and are in use for numeric display devices. Typical devices are sold by Industrial Electronic Engineers, Inc. of Van Nuys, California such as series 1500-01; by American Micro-Systems, Inc. of Santa Clara, Calif. such as model no. 21450; by RCA of Somerville, N. J. and by other well known sources. Such liquid crystal devices are typically composed of only microns thick liquid crystal material contained between glass substrates or plates with transparent electrodes etched on a glass substrate. When the electrodes are excited, the liquid crystal material changes the transmissivity and reflectivity characteristics. Liquid crystal material may be of the nematic, smectic, cholesteric, and other well known types. Excitation is typically alternating current of 60 Hz frequency, 20 volts and with only micro-amperes of current. Liquid crystal displays are further discussed in the March 1972 issue of Computer Design Magazine on pages 77 and 78 entitled A Comparison and Review of Digital Readouts by Sidney Davis and in the November 1971 issue of the Proceedings of the IEEE entitled Liquid Crystal Matrix Displays by Lehner et al wherein these articles are incorporated herein by reference. Because liquid crystals and the associated arrangements such as alternating current excitation devices are well known in the display technology, a liquid crystal display device and the associated excitation may be shown in block diagram or schematic form without specifically showing these well known excitation arrangements. Similarly, because the selective control of areas of liquid crystal devices such as the control of display segments by etched electrodes are well known in the art, controlled areas of variable transmissivity and reflectivity characteristics need be shown only in the form and shape of the desired controlled area without showing the construction, selective etching, and excitation which are well known in the art.

For simplicity of discussion, illumination amplifier arrangements may be discussed with respect to simple area control of illumination. Several embodiments are presented herein using amplifier segments such as concentric rings (FIG. 8C) bands or stripes (FIGS. 7B and 8B) and patterns (FIGS. 7C and 8A). It will become obvious that more complex arrangements may be provided such as intricate patterns of controllable amplifiers. Such a pattern may be a dot pattern similar to the well known half tone dot patterns widely used in the printing art. Other patterns will become obvious to those skilled in the art.

Digital Excitation

Digital control of an illumination amplifier is relatively simple when compared to analog control, where a digital control signal may be either on for exciting an illumination amplifier or off for non-exciting an illumination amplifier. An alternating current excitation may be used with a liquid crystal type of illumination amplifier. In such an arrangement, an electronic switch may be used to provide controlled excitation for the amplifier by selectively switching a sinusoidal excitation signal.

Figure 2A:
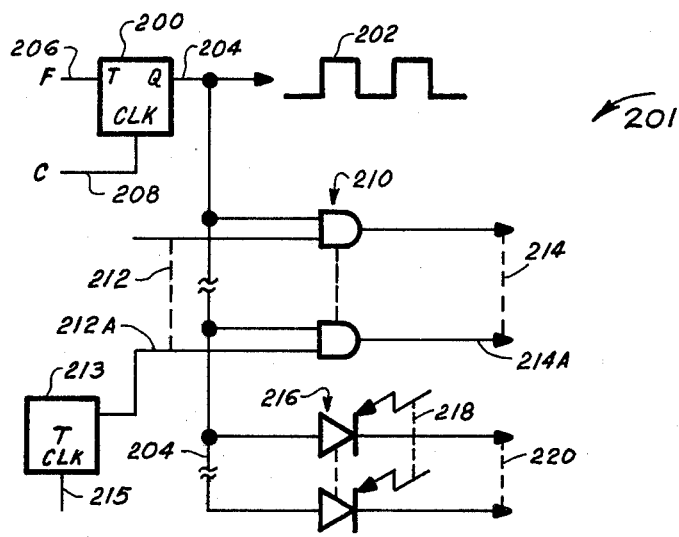
FIGS. 2A-2D illustrate various excitation arrangements for illumination amplifiers in schematic and waveform diagrams comprising FIG. 2A showing a digital excitation arrangement, FIG. 2B showing pulse modulation waveforms, FIG. 2C showing an analog excitation arrangement, and FIG. 2D showing pulse width modulation waveforms.

A digital excitation arrangement 201 is shown in FIG. 2A, where a well known flip-flop 200 is arranged to selectively generate a square wave 202 as output signal Q on line 204. When the F input 206 is true, the flip-flop 200 will change state for each clock pulse 208, thereby generating an output signal 204 at a frequency that is half of the frequency of clock signal 208. When the F input 206 is false, flip-flop 200 will maintain its output state and will not be responsive to the clock signal. Therefore, flip-flop 200 will digitally generate an alternating excitation signal 202 at half the frequency of clock signal 208 as controlled by logic signal 206. The digital clock signal C 208 may be the output of count down logic to provide a clock pulse at the desired frequency.

For one digital excitation embodiment, a continuous squarewave 202 is generated to provide an alternating excitation signal such as with input signal 206 to flip-flop 200 maintained true for a continuous squarewave 202 as output signal 204. Output signal 204 may be selectively gated with AND gates 210 controlled with select signals 212 to selectively generate amplifier excitation which may be square wave excitation signals 214 for a plurality of illumination amplifier devices.

It has been found that digital excitation has particular advantages because of (1) the well known low power characteristic of switching devices as compared to linear amplifying devices and (2) the convenience of generating squarewave signals with digital circuits such as flip-flop 200. Also, the low power requirements of many illumination amplifier devices may permit direct excitation with logic signals 204 and 214.

As described herein, illumination sensitive transducers may be used to convert an illumination signal into an electrical signal for control of an illumination amplifier. In such an arrangement, the transducer may be a photosensitive switch such as the well known family of gated rectifiers such as silicon controlled rectifier (SCR) type devices. These gated rectifier devices may be arranged for gating with an illumination signal to generate alternating excitation directly from an illumination signal. Transducers 216 may be such illumination sensitive gated rectifier devices. Devices 216 may be arranged to be responsive to illumination signals 218 to switch an excitation signal such as square wave 204 to output lines 220 to excite various illumination amplifiers. The square wave nature of the excitation signal 204 provides for automatically extinguishing of transducers 216 when illumination gate signal 218 is removed, thereby removing squarewave excitation from amplifier control lines 220. The well known gated rectifier technology will permit other excitation arrangements such as SCR control of sinusoidal signals. Gated rectifier devices are herein intended to include the well known group of gated switches characterized by SCR devices and including triacs and other SCR type devices. Typical devices are the General Electric photo SCR type H10C1, the General Electric photo switch type L1V, and other photo sensitive devices.

Excitation arrangement 201 provides a detailed illustration of a command arrangement that may be part of the illumination control system illustrated in FIG. 1 where excitation arrangement 201 may be included in command signal processor 128; where command signals 126 from command device 127 may include command signal F 206 to flip-flop 200, command signals 212 to gates 210 and command signal 215 to flip-flop 213; and where processed command signals 132 and 133 may include processed command signals 204, 214, and 220. In another embodiment, illumination signals 106 may include illumination signals 218, transducers 134 may include gated rectifiers 216, and transducer signals 114 may include transducer signals 220.

Analog Excitation

Analog control of an illumination amplifier is relatively more complex than the digital control discussed above, where the analog control signal may take any one of a range of values and may be continuously adjustable over that range. Such an analog control arrangement may have particular advantages when compared to a digital control arrangement such as continually variable transmissivity-reflectivity characteristics for analog operations including closed loop illumination servo arrangements.

Analog excitation devices may be implemented as pulse modulted devices or as amplitude devices. Illumination amplifiers may be able to operate on analog amplitude signals permitting a relatively simple excitation arrangement, but many types of illumination amplifiers such as certain liquid crystal devices cannot directly utilize analog amplitude signals and, therefore, must be excited with pulse modulated signals. A pulse modulated signal operates on the principal of constant amplitude and variable duty cycle, including pulse width modulated and pulse rate modulated analog signals.

An arrangement using analog amplitude excitation depends on the ability of an illumination amplifier to control an amplifier characteristic such as the transmissivity-reflectivity characteristic discussed herein as a function of or proportional to the analog amplitude of the excitation signal. Analog amplitude signals are relatively simple to obtain because many devices such as illumination transducers provide output electrical signals proportional to the input illumination signals. Analog command devices that provide analog amplitude outputs such as digital-to-analog converters and potentiometers are well known in the art and will be discussed hereafter in relation to FIGS. 2C and 9B.

An arrangement using pulse modulated analog excitation is more generally applicable than an analog amplitude arrangement because certain types of illumination amplifiers may not be controllable with analog amplitude signals. Also, certain types of illumination amplifiers may be moe precise when controlled with pulse modulated (on-off) signals. Pulse modulated signals will now be described with reference to FIG. 2B.

Pulse width modulation control is illustrated with signals 222 and 223; where signal 222 has a low duty cycle with a narrow pulse 226 and signal 223 has a higher duty cycle with a wider pulse 227. As the analog parameter varies from zero to maximum, the pulse width varies from virtually no pulse through a range of widening pulses to the extreme of the signal being in the high state 226, 227 virtually continuously. Therefore the area under the pulses known in the art as the duty cycle varies proportionally with the analog parameter.

Pulse rate modulation control is illustrated with signals 224 and 225; where signal 224 has a low duty cycle with a low pulse rate or a wide spacing 228 between pulses 229 and 230 and where signal 225 has a high duty cycle with a high pulse rate or a narrow spacing 231 between pulses 232 and 221. As the analog parameter varies from zero to maximum, the pulse rate varies from virtually no pulses through a range of greater numbers of pulses over a given period to the extreme of the signal being in the high state virtually continuously. Therefore, the area inside the pulses or the duty cycle varies proportionally with the analog parameter. For pulse rate modulation, pulses 229, 230, 232, and 221 may have a constant pulse width as contrasted to pulse width modulation pulses described above.

For pulse modulation control, a pulse frequency or frequency range may be selected based upon the dynamic requirements of the application. For a visual application, a rate of 30 Hz or greater may be required because the human eye may detect flicker at lower frequencies. For various control applications, pulse rates may be permitted below the rate of a pulse every several seconds or pulse rates may be required exeeding thousands of pulses per second. A particular illumination amplifier may be selected for its dynamic response characteristics to satisfy the dynamic requirements of the system.

An analog amplitude signal characteristic may be obtained from a pulse modulated signal by integrating pulse modulated signals. This integration may be inherent in the system such as with an illumination amplifier, a transducer, or the human eye. In certain systems it may be necessary to provide filtering or integration such as with reactive electronic components in electronic circuits or other well known electronic and illumination integrating devices.

Pulse modulation devices may be analog amplitude to pulse modulation converters which accept analog amplitude inputs and generate pulse modulated outputs. A preferred embodiment of an analog control may include a pulse width modulation device, although other pulse modulation devices may be used such as the well known reset integration pulse rate modulation device.

Figure 2C:
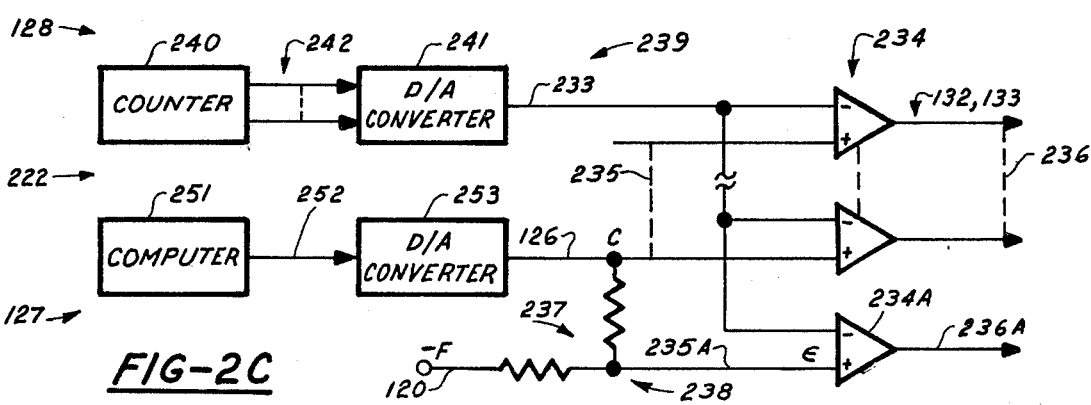
Figure 2B:
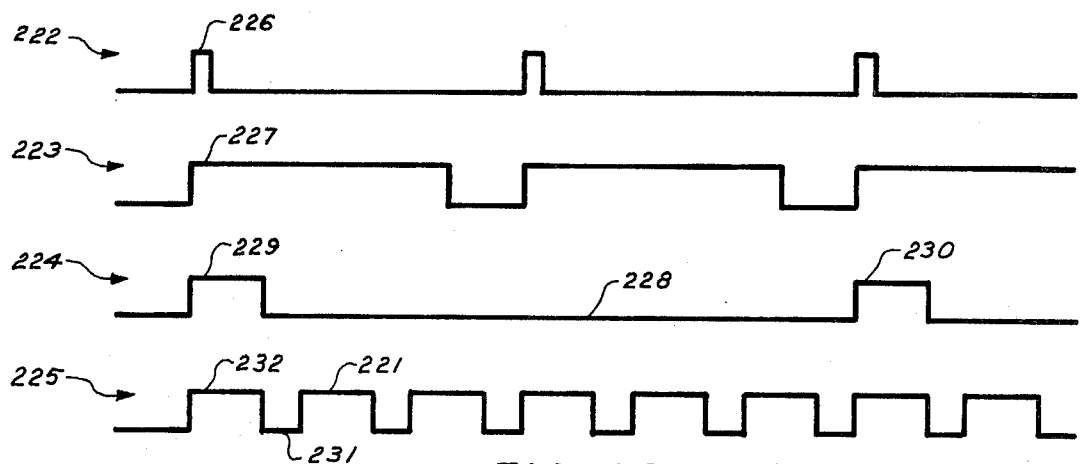
Figure 2D:
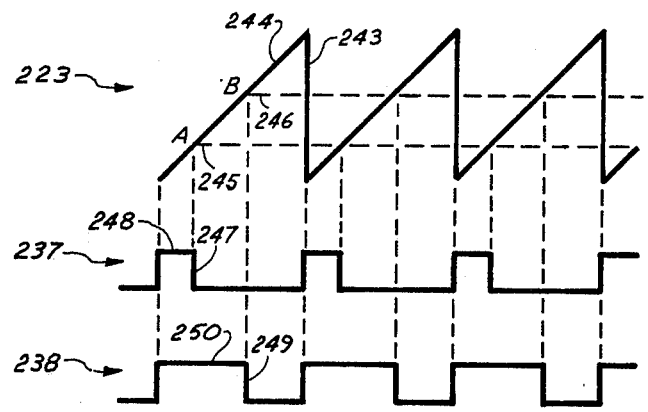

A preferred embodiment of a pulse width modulation arrangement is shown in FIG. 2C and will be described with respect to the waveforms shown in FIG. 2D. Modulator 222 generates a ramp waveform 223 on line 233 which provides a reference input to comparators 234. Each comparator 234 compares a ramp signal 233 with an input analog signal 235 to generate a pulse width modulated output signal 236. Output signals 236 are pulse width modulated signals similar to waveforms 237 and 238; where each output signal 236 such as waveforms 237 and 238 goes true at the start of ramp 223 and remains true as long as the ramp 223 has an amplitude that is less than an input signal 235. When ramp 233 makes a transition to being more positive than an input signal 235, a corresponding output signal 236 goes false providing a pulse that has a width proportional to the amplitude of the input analog signal.

Ramp generator 239 is composed of counter 240 and digital-to-analog converter 241. Counter 240 is a well known digital counter that counts to a maximum value, then overflows to a zero value, then counts back up to the maximum value. Digital output signals 242 of counter 240 excite a well known digital-to-analog (D/A) converter 241 that may include a weighted resistor ladder and analog switches, but may be other well known D/A converter arrangements. Converter 241 provides an analog output 233 proportional to the input count parameter 242. Therefore, output signal 233 is a sawtooth waveform 223 that is reset 243 when counter 240 overflows and that generates a ramp 244 as the count in counter 240 increases.

For illustrative purposes, analog voltage levels A 245 and B 246 are superimposed on ramp 244 of waveform 223. At the beginning of the ramp, the output signals 236 of two of the comparitors 234 are shown as waveforms 237 and 238 related to a pair of input signals 235 having amplitudes A 245 and B 246, respectively. As ramp 244 increases but remains below input signal thresholds 245 and 246, output signals 237 and 238 remain high. As ramp 244 makes a transition through amplitude A 245, the ramp amplitude 244 becomes greater than the input signal amplitude 245 and a comparitor 234 causes the output signal 237 to make a transition 247 to the low state. Therefore, pulse width 248 is proportional to amplitude A 245. Similarly, as the ramp amplitude 244 makes a transition through amplitude B 246, a comparitor 234 causes the output signal 238 to make a transition 249 to the low state. Therefore, pulse width 250 is proportional to amplitude B 246 which is proportionally greater than pulse width 248 by the same amount that amplitude B 246 is greater than amplitude A 245.

A computer or other digital command device can provide a command input to an illumination amplifier such as with amplifier excitation channels 236. In one embodiment, computer 251 generates output commands 252 to at least one D/A converter 253, which provides a command signal 235 to a comparitor 234 for generating a pulse width modulated signal 236 to control an illumination amplifier. Other digital command arrangements for controlling analog illumination devices will become obvious to those skilled in the art.

A servo summing junction may be incorporated into modulator 222 as summing junction 238 comprising well known arrangements such as summing resistors 237. An analog command signal such as command signal C 126 may be summed with a negated feedback signal such as feedback signal-F 120 to generate an error (difference) signal ϵ 235A as an analog command signal. Pulse width modulator 222 will then generate a pulse width modulated excitation signal 236A with comparitor 234A for controlling an illumination servo amplifier. Summing junction 238 and modulator 222 will be further discussed hereafter in relation to a servo system illustrated in FIG. 5.

Comparitors 234 are well known in the art and may be Fairchild integrated circuit comparitors serial no. 710.

Modulator 222 has been found to have particular advantage for a system requiring a plurality of independent pulse width signal conversions because much of the control devices are common to all conversion channels, such as counter 240 and converter 241 being common to all channels 236.

Excitation arrangement 222 provides a detailed illustration of a command arrangement that may be part of the illumination control system illustrated in FIG. 1 where command device 127 may include computer 251 and D/A converter 253; where command signal 126 from command device 127 may include command signals 235; where command signal processor 128 may include counter 240, converter 241, and comparitors 234; and where processed command signals 132 and 133 may include processed command signals 236.

An alternate embodiment of a pulse modulated excitation arrangement is provided in the copending applications referenced above. This alternate embodiment provides pulse modulated waveforms directly as outputs from a digital computer. Other arrangements for generating pulse modulated waveforms will become obvious to those skilled in the art.

Material Cancelled and Incorporated By Reference

Some material common with grandparent U.S. Pat. No. 3,986,022 has been cancelled herein and is incorporated by reference therefrom. In particular, the sections entitled Schematic Notation, Illumination Computer, Digital Control Arrangements, Analog Control Arrangements, Batch Fabricated Arrangement, Closed Loop Control, Flat Plane Configuration, Discrete Illumination Device, Light Pen Arrangement, Illuminated Switches, Color Control, Control Of Natural Illumination, Illumination Control For Buildings, Illumination Control For Vehicles, Illumination Shade, Temperature Control, Control Of Artificial Illumination, Lamp Control, Dimmer Control, Flasher Control, Camera Systems, Image Rotation Control, Aperture Control, Shutter Control, Photographic Camera System, Source Illumination Control, and Audience Display System have been cancelled herein and are herein incorporated by reference from grandparent U.S. Pat. No. 3,986,022 at column 11 line 1 to column 55 line 27 therefrom.

Illumination Chopper, Scanner, and Modulator

The illumination amplifier feature of the present invention provides an improved means and method for chopping, scanning, and modulating illumination. Prior art devices typically involve rotating mirrors or CRT flying spot scanners, as discussed in the articles (1) Optical Scanners; Comparisons and Applications by Compton published in the February 1976 issue of Electro-Optical Systems Design and (2) Laser/Galvo Scanner Design by Tenney et al published in the October 1975 issue of Electro-Optical Systems Design magazine at pages 40-45 and herein incorporated-by-reference. The illumination amplifier feature of the present invention can provide further advantages in combination with prior art devices. For example, the reflective surfaces used in many prior art electromechanical scanners can be replaced by the illumination amplifier arrangement of the present invention to provide electro-optical control in place of or in addition to prior art electro-mechanical control. Still further advantages may be achieved with a fully solid-state illumination control scanner, chopper, or modulator device as discussed below with reference to FIGS. 12A-12C.

An illumination amplifier device is shown in FIG. 12A that may be used as an optical scanner, chopper, or modulator. Illumination amplifier segments 1210-1217 may be individually controlled such as to be either reflective or transmissive in response to electrical control signals. Illumination signal 102, shown incident upon scanner 1200, is transmitted by segments controlled to be transmissive such as with illumination 102 transmitted through segment 1210 to illuminate sensor 134.

Illumination 102 may be chopped by selectively controlling segments 1210-1217 to be sequentially or randomly transmissive and reflective. A sequential rotary scan will now be described for simplicity although other non-sequential scans may be provided. In the rotary scan, one and only one segment is controlled to be transmissive, wherein each of the segments is sequentially controlled to be transmissive. For example, segment 1210 may be transmissive and segments 1211-1217 may be controlled to be reflective, then segment 1211 may be controlled to be transmissive and segments 1210 and 1212–1217 may be controlled to be reflective, then segment 1212 may be controlled to be transmissive and segments 1210–1211 and 1213–1217 may be controlled to be reflective etc as shown in the table listing Sequential States. This table lists the repetitive sequence of scanner states and the transmissive and reflective segments for each state.

| SEQUENCE | SEQUENTIAL STATES CONTROL SIGNAL | TRANSMISSIVE SEGMENTS | REFLECTIVE SEGMENTS |
| --- | --- | --- | --- |
| 0 | B0 | 1210 | 1211–1217 |
| 1 | B1 | 1211 | 1210, 1212–1217 |
| 2 | B2 | 1212 | 1210–1211, 1213–1217 |
| 3 | B3 | 1213 | 1210–1212, 1214–1217 |
| 4 | B4 | 1214 | 1210–1213, 1215–1217 |
| 5 | B5 | 1215 | 1210–1214, 1216–1217 |
| 6 | B6 | 1216 | 1210–1215, 1217 |
| 7 | B7 | 1217 | 1210–1216 |
| 0 | B0 | 1210 | 1211–1217 |

After a complete scan with all segments, the scan may continue sequentially from segment 1217 to segment 1210 and repeat the sequence. This rotating scan concept is analogous to the well-known mechanical rotating chopper used on astrotrackers such as the Kollsman KS-50 astrotracker and other angular positioning devices.

A solid-state scanner will now be described with reference to FIG. 12B using illumination amplifier devices. In the prior art, scanner arrangements use oscillating or movable mirror arrangements such as used in the Xerox electrostatic copier machine, where a mirror is rotated or oscillated to scan a document for printing purposes. Other mechanical scanner arrangements are well known in the art. Problems exist with such prior scanners, where electro-mechanical scanners traverse a fixed scan cycle due to inertial characteristics and where the optical output may be "smeared" due to the continuous motion of the mechanical scanner. A solid-state electro-optical scanner in accordance with the present invention provides discretely selectable conditions selectable under electronic control independent of inertia and other such sequential characteristics thereby permitting random scan arrangements and virtually any scan sequence. Further, the scanner arrangement in accordance with the present invention permits discrete scan position to be selected and maintained, thereby providing a continuously changing image to the illumination destination and minimizing the blur or smearing effect of a continuous scan. The scanner of the present invention will be exemplified with a simple description to exemplify the inventive features. It is intended that this simple description be interpreted in a broad form to include more complex scanning arrangements such as having a greater number of scan positions, using devices other than the liquid crystal devices, being constructed with other techniques, providing continuous scanning in contrast to discrete scanning, and incorporating the various other teachings of this inventive feature.

For simplicity, this generalized scanner concept will be discussed for a multi-layered liquid crystal embodiment although other configurations will become obvious from the teachings thereof. A glass substrate 1222 may be composed of many layers of glass at different angles 1221 all stacked and bonded together and containing liquid crystal illumination amplifiers therebetween such as with well-known etched electrodes and liquid crystal material in each layer interface 1230–1237. Scanning is achieved by sequentially selecting different layers having different reflective angles to be reflective thereby reflecting illumination to or from different locations. For example, if device 1224 is an illumination sensor, scanner 1220 will sequentially detect illumination from illumination paths 1240–1247 as the scanning progresses along path 1223. Alternately, device 1224 may be an illumination source where an illumination signals 1240–1247 may be scanned across element 1223 for selective illumination. Illumination signals from a source 1224 may be further processed with well-known electronics. For example, illumination signals 1240–1247 may be accumulated with lens systems after illuminating scanned element 1223 for processing with illumination sensors.

In accordance with FIG. 12B, a plurality of illumination amplifier devices may be arranged having a depth dimension into the support medium such as a glass medium for liquid crystal devices, wherein the illumination must traverse transmissive illumination amplifier elements until it reaches a reflective element. For example, if a first element 1230 closest to the surface is reflective, illumination will be reflected in a direction 1240 determined by this surface element, and if the first element 1230 closest to the surface is transmissive, illumination will be transmitted to a second amplifier 1231 next closest to the surface through the first transmissive element 1230. If the second element 1231 is reflective, illumination will be reflected in a direction 1241 determined by this second element 1231 which is the first reflective element, and if the second element 1231 is transmissive, illumination will be transmitted to a third amplifier 1232 next closest to the surface through the first two transmissive amplifier elements 1230 and 1231 and so forth until the illumination is incident upon a first amplifier having a reflective characteristic. This first amplifier having a reflective characteristic will determine the selected angle of the scanner. Therefore, the illumination from the source may be transmitted through a plurality of illumination amplifiers that are non-reflective until incident upon the first illumination amplifier that is reflective, thereby electro-optically selecting the particular scanner angle.

For simplicity of discussion, a sequential scanning arrangement of scanner 1220 will now be discussed. For simplicity of illustration, it shall be assumed that one and only one amplifier layer 1230–1237 of layers 1221 is controlled to be reflective and all other amplifier layers are controlled to be transmissive although other scans may be provided to make combinations of elements 1230–1237 reflective and transmissive. For a sequential scan, illumination amplifier 1230 is first controlled to be reflective thereby generating reflective illumination signal 1240, then amplifier 1230 is controlled to be transmissive and amplifier 1231 is controlled to be reflective thereby generating reflective illumination signal 1241, then amplifiers 1230 and 1231 are controlled to be transmissive and amplifier 1232 is controlled to be reflective thereby generating reflective illumination signal 1242, etc. The sequential scan may proceed as shown in the table listing Scan States. This table lists the repetitive sequence of scanner states and the transmissive and reflective elements for each state.

| SEQUENCE | CONTROL SIGNAL | SCAN STATES TRANSMISSIVE SEGMENTS | REFLECTIVE SEGMENTS | ILLUMINATION SIGNAL |
|---|---|---|---|---|
| 0 | B0 | 1231–1237 | 1230 | 1240 |
| 1 | B1 | 1230, 1232–1237 | 1231 | 1241 |
| 2 | B2 | 1230–1231, 1233–1237 | 1232 | 1242 |
| 3 | B3 | 1230–1232, 1234–1237 | 1233 | 1243 |
| 4 | B4 | 1230–1233, 1235–1237 | 1234 | 1244 |
| 5 | B5 | 1230–1234, 1236–1237 | 1235 | 1245 |
| 6 | B6 | 1230–1235, 1237 | 1236 | 1246 |
| 7 | B7 | 1230–1236 | 1237 | 1247 |
| 0 | B0 | 1231–1237 | 1230 | 1240 |

When the last amplifier 1227 is controlled to be reflective to generate illumination signal 1247, then scanner 1220 may be controlled to "retrace" by making amplifier 1230 again reflective and thereby retracing from signal 1247 to signal 1240 to start a new scan along element 1223.

An alternate embodiment is illustrated with the following Alternate Scan States table.

| SEQUENCE | CONTROL SIGNAL | ALTERNATE SCAN STATES TRANSMISSIVE SEGMENTS | REFLECTIVE SEGMENTS | ILLUMINATION SIGNAL |
|---|---|---|---|---|
| 0 | B0 | NONE | 1230–1237 | 1240 |
| 1 | B1 | 1230 | 1231–1237 | 1241 |
| 2 | B2 | 1230–1231 | 1231–1237 | 1242 |
| 3 | B3 | 1230–1232 | 1233–1237 | 1243 |
| 4 | B4 | 1230–1233 | 1234–1237 | 1244 |
| 5 | B5 | 1230–1234 | 1235–1237 | 1245 |
| 6 | B6 | 1230–1235 | 1236–1237 | 1246 |
| 7 | B7 | 1230–1236 | 1237 | 1247 |
| 0 | B0 | NONE | 1230–1237 | 1240 |

Many other alternate embodiments may be provided from the teachings herein.

The scanner inventive feature described above may be characterized as selecting a sequence of elements having different reflective angles to select each of a plurality of sources of illumination (or to select each of a plurality of destinations of illumination) having different angles of incidence (or having different angles of reflection) to provide substantially a constant reflective angle (or incidence angle) to provide reflected illumination to a sensor (or from a source). Other characterizations may include a solid-state scanning device, an electro-optical device for scanning a plurality of sources of illumination to provide scan illumination to a receiver, and a plurality of illumination amplifier devices each having different angular positions for selecting different sources of illumination for reflecting selected illumination to a receiver device.

The illumination amplifier scanner of the present invention may take many forms, where one form is a plurality of individual discrete illumination amplifier elements arranged at different angles. Another form may be provided as a batch fabricated illumination amplifier as shown in FIG. 4 where a plurality of illumination amplifier surfaces such as surfaces 440 and 457 may be sequentially selected to reflect (or transmit) different source images to a common receiver element. Still another embodiment may be a planner arrangement such as illustrated in FIG. 6A, where amplifier elements 602–605 may each be provided having a different angle and where each may be selected in sequence to be reflective to reflect different images to a common destination element. Other scanner embodiments may be arranged as concentric squares and circles as illustrated in FIGS. 8B and 8C, wherein each segment may be arranged at a different angular position. Other configurations may be provided such as determined by convenient manufacturing methods to provide a plurality of illumination amplifiers having different angular positions therebetween in accordance with the teachings of the scanner feature of this invention.

A multi-dimensional scanner arrangement may be provided having a two-dimensional angular orientation between a plurality of illumination amplifier elements. In one batch fabricated arrangement, a spherical surface may be provided having facets arranged about the surface of the spherical device having different orientations in two dimensions.

One optical scanner in accordance with the present invention may be characterized as a single photosensor with a plurality of electronically controlled amplifier elements each selecting a particular source or direction for reflecting to the single photosensor. The photosensor and associated electronics may be considered as being time-shared between a plurality of source elements selectable with the illumination amplifier elements.

The scanner feature of the present invention may be usable in place of present well-known scanner arrangements including the rotating mirror associated with a Xerox copy machine, the rotating mirror and photocell arrays associated with optical character recognition systems, a Vidicon and other tube scanners associated with television cameras, flying spot scanners, and other well-known scanning devices.

Scan control may be provided with the relatively simple counter and decoder arrangement of FIG. 12C or may be provided with higher capability electronics such as a digital computer controlled scan. In order to exemplify this feature of the present invention, a simple sequential scan arrangement will be discussed with reference to FIG. 12C. Sequential scanning may be controlled with binary counter 1204 being repetitively sequenced through eight counts under control of clock signal CK. The sequential binary count from counter 1204 may be decoded with decoder 1205 to generate one of eight control signals B0–B7 in response to the three binary encoded signals B, C, and D from counter 1204. Each of the eight control lines from decoder 1205 may be used to control a different amplifier segment of scanner 1200 (FIG. 2A) and a different amplifier level of scanner 1220 (FIG. 2B). For example, decoder output signals B0–B7 may control amplifier segments 1210–1217 respectively of scanner 1200 and may control amplifiers 1230–1247 respectively of scanner 1220. As counter 1204 sequences through the binary count, decoder 1205 sequences through the eight control signals B0–B7; wherein the selected control signal from decoder 1205 will cause the related segment of scanner 1200 to become transmissive (operating in the transmissive mode) and will cause the related amplifier of scanner 1220 to become reflective (operating in the reflective mode). Counter 1204 and decoder 1205 may be well-known Texas Instruments S/N 7400 integrated circuit logic wherein counter 1204 may be an S/N 7491 counter and decoder 1205 may be a S/N 7445 decoder.

For simplicity of discussion, mutually exclusive control has been described where one and only one segment of scanner 1200 is controlled to be transmissive and one and only one amplifier of scanner 1220 is controlled to be reflective, but many other combinations can be provided. For example, scanning may be random in nature for adaptive scanning or may be selective in nature to select a particular segment or angle without traversing a sequential scan. Further, various combinations of segments and amplifiers may be controlled to be transmissive or reflective.

For further simplicity of discussion, the angular dimensions and resolution of amplifier segments 1210–1217 and amplifiers 1230–1237 are shown in exaggerated form. In other embodiments, the segments of scanner 1200 may have fine angular resolution such as 1024 segments being used instead of the eight segments of the present example. Further, the angles of amplifiers 1230–1237 of scanner 1220 may have greater resolution such as 1024 scanning angles in place of the eight angles of this example. Still further, the interchangability of the reflective and transmissive modes as discussed above permits the scanners to operate in either the reflective or transmissive mode. For example, scanner 1200 has been discussed for transmissive mode operation and scanner 1220 has been discussed for reflective mode operation, where alternately scanner 1200 may operate in the reflective mode and scanner 1220 may operate in the transmissive mode.

Still further, control may be provided in analog form wherein amplifiers 1210–1217 of scanner 1200 and amplifiers 1230–1237 of scanner 1220 may be controlled to be partially reflective and partially transmissive such as by using the pulse modulated control arrangement discussed with reference to FIG. 2.

Yet further, an analog scan may be provided by implementing continuously variable controls such as discussed in U.S. Pat. No.3,675,988 to Soref, which is herein incorporated-by-reference, thereby providing a continuous scan in contrast to the discretely stepped scan discussed with reference to FIGS. 12A–12C.

A closed loop adaptive scanner embodiment will now be discussed with reference to FIG. 1. Command device 127 may be an adaptive command device such as a stored program digital computer or may be other well-known adaptive command devices. Command device 127 generates command signal 126 to the command signal processor 128, as previously discussed with reference to FIG. 1. Control signals 133 to amplifier 104 may control amplifiers 1210–1217 and amplifiers 1230–1237 (FIGS. 12A and 12B), wherein these amplifier elements are included in the general amplifier block 104. Illumination transmitted or reflected to illumination detectors as shown in FIG. 12 corresponds to illumination 110 to sensor 134 (FIG. 1). Sensor signal 114 may be communicated to adaptive device 127 as signals 139 for adaptive control. Command device 127 may command scanning or monitoring with a single amplifier angle and may adaptively change the monitored angle to optimize the feedback signal 139. Adaptive control with feedback to a digital computer is discussed in applications Ser. No. 134,958 and Ser. No. 135,040 for a machine control system and are equally applicable to the illumination control system of the present invention.

A specific use of the electro-optical chopper of the present invention will now be discussed in detail to exemplify the more general features of the present invention.

Mechanical chopper arrangements are well known in the prior art such as illumination choppers used for startrackers such as the Kollsman Automatic Astro Compass type KS-50-03. Such prior art devices provide a rotating mechanical shutter that permits incident light to be transmitted or blocked as a function of the angular position of the incident light and the phase of the mechanical shutter rotation.

In accordance with the teachings of the present invention, an illumination amplifier chopper may be provided using amplifiers 104 controlled by signals 133 to chop illumination 102 to generate chopped illumination 106. Amplifiers 104 may be arranged with segments having a particular orientation, discussed with the reference to FIG. 12A. Control signals 133 select the various segments in sequence, which may be a clockwise or counter-clockwise sequence as with the mechanical choppers or, in a preferred embodiment, may select the segments in a random access sequence such as may be defined under control of command devices 127 which may include a computer 251.

In a preferred mode of operation, an initial acquisition scan such as a complete clockwise scan using all segments may be performed to initially locate an image. After an image has been located, only segments closely associated with the image location may be scanned in an adaptive manner to increase the duty cycle of the chopped signal and to decrease the re-acquisition time. This adaptive capability provides significant advantages over prior art mechanical chopper arrangements, where mechanical choppers and other sequential devices do not provide selective or random access illumination chopping capabilities. The electronic control arrangement of the present invention permits external illumination to be chopped in almost any desired random order or sequence based upon optimizing the particular system considerations.

In contrast to prior art illumination chopper systems, the system of the present invention provides null seeking capability with a computer contained in command devices 127 (FIGS. 1 and 9B) for commanding the selective chopping of illumination with amplifiers 104 under control of command signals 126 to command signal processors 128 to generate control signals 133 to provide chopped illumination 106. Transducer 134 generates feedback signals 114 to signal processors 116, where computer 251 in command devices 127 is responsive to feedback signals 139 to determine the location of the illumination. Computer 251 and command devices 127 control the system to center the illumination such as by controlling a gimballed startracker to reposition the image in the telescope, as is well known in the art. Computer 251 would continually adjust such a controlled arrangement to center the illumination in response to the chopped feedback signals until incident illumination is centered, indicative of equal feedback signals when each of the illumination amplifier segments 104 were selected by computer 251.

In one embodiment of the scanning arrangement shown in FIG. 12A, digital counter 1204 included in command devices 127 generates binary output signals 1206 included in signals 126 to decoder 1205 included in command signal processor 128. Decoder 1205 decodes binary inputs signals 1206 to generate individual select output signals B0-B7 which sequentially select segments 1210-1217 or 1230-1237 to chop input illumination 102 to generate chopped output illumination 106 to illuminate transducer 134. The output of transducer 134 excites signal condition devices 116 to generate feedback signal 139 such as by loading the output of counter 1204 into the computer when the chopped signal 106 illuminates transducer 134. Therefore, the number loaded into the computer is indicative of the segment of chopper 104 upon which illumination 102 is projected, where the number loaded into the computer is indicative of the direction in which illumination 102 is off from the center 1201 of the chopper.

The number loaded into the computer may be used to identify the off-center condition of illumination 102 to process information, or to control the system, or both in response thereto using well-known prior art arrangements.

Chopper arrangement 1200 is shown in a simplified embodiment in FIG. 12A to exemplify the present invention. It will become obvious from the teachings of the present invention that more sophisticated arrangements may be configured, where the computer may directly or indirectly generate select signals B0-B7 in either a sequential form as described above or in a random access form to select particular segments in order to optimize system considerations.

Further, a computer may receive feedback signal 139 as a discrete input signal as described in the referenced copending applications to identify the segment illuminated by illumination 102. In one embodiment, computer 251 in command device 127 and command signal processor 128 may replace counter 1204 and decoder 1205 to generate select signals B0-B7 in a preferred sequence or in a random manner and may monitor output signal 139 of sensor 134 to determine the off-center direction of illumination 102. In another embodiment, the computer may select a particular segment 1210-1217, then monitor signal 139 to determine the illumination condition, then continue to interrogate the various segments 1210-1217 and, in conjunction with each interrogation, monitor signal 139 to determine the off-center direction of illumination 102. In still another embodiment shown in FIG. 9B, computer 251 may receive feedback signal 139 as a whole number digital signal from an analog-to-digital converter 138 included in feedback signal processor 116 to define the relative amplitude of illumination intensity.

In yet another feedback embodiment discussed with reference to FIG. 12C, sensor 134 (also shown in FIG. 12A) may receive chopped illumination 106 (FIG. 12A) and may generate feedback signal 114 to C-Register 1207 to load output signals 1206 from counter 1204 into C-Register 1207 in response to feedback signal 114. The contents of C-Register 1207, indicative of the angular position of incident illumination 102 (FIG. 12A) may be loaded into computer 251 for control of scanner 1200 and for control of other system operations. Loading of C-Register 1207 and communication between C-Register 1207 and computer 251 is discussed in the referenced applications, particularly in application Ser. No. 291,394.

Mechanical scanners are well known in the art and interfacing thereof may be used to interface the electro-optical scanner of the present invention.

A preferred arrangement for interfacing chopper 1200 with an electronic system such as with a computer will now be discussed with reference to FIGS. 12A and 12C. Chopping of illumination signal 102 to obtain chopped illumination signal 106 provides a phase relationship that determines the direction of offset of illumination 102 from being focused directly on the center 1201 of scanner 1200. Sensor 134 generates output pulse 114 when chopped illumination 106 illuminates sensor 134. This condition occurs when counter 1204 commands the segment that is illuminated by the off-center illumination, which is segment 1210 in the example shown in FIG. 12A, to be transmissive thereby illuminating sensor 134 with chopped illumination 106. Therefore, the state of counter 1204 when sensor 134 detects chopped illumination 106 identifies the segment transmitting the chopped illumination 106 and therefore identifies the direction of the incident illumination 102. The mechanization shown in FIG. 12C can provide feedback to an electronic system where sensor 134 generates output signal 114 when counter 1204 controls the segment having the incident illumination 102 transmitted thereon to be transmissive. Therefore, sensor signal 114 (FIG. 1) may be used to control loading of signals 1206 from counter 1204 into C-register 1207 for storing identification of the segment related to the direction of incident illumination 102. C-register 1207 may then be used as an interface register between scanner 1200 and an electronic system which may include a computer 251 (FIGS. 2C, 9B, and 12C).

The electronic system interface may be better understood relative to the disclosures in the referenced co-pending applications. For example, the C-register interface with a computer is discussed in detail in application Ser. No. 101,881; particularly with reference to FIG. 13 therein showing C-register 260. Further, a preferred embodiment of the C-register is discussed in application Ser. No. 291,394 particularly with reference to FIG. 7 therein. Said FIG. 7 shows C-register 460 being loaded with input signals 708 in response to load strobes $\overline{DC\text{-}7}$ and $\overline{DC\text{-}3}$ and the transfer of the loaded information from C-register 460 to A-register 706 in computer 112 as discussed therein, where strobe $\overline{DC\text{-}7}$ may be output signal 114 from sensor 134 discussed herein and in application Ser. No. 366,714. Still further, a sequence of control signals may be generated in response to an input signal with the mechanization disclosed in application Ser. No. 302,771; particularly with reference to FIG. 5 therein; wherein input signal 283 is processed with digital electronics to generate a sequence of clear signal 506 and enable signal 508 which may be used to clear and load the C-register; as discussed above for FIG. 7 of application Ser. No. 291,394; in response to the input signal 114 from sensor 134. Alternately, computer 251 may directly monitor output signal 114 of sensor 134 such as with a skip-on-discrete instruction and may directly control transmissivity and reflectivity of segments 1210-1217 such as by using the C-register discussed above as an output register.

An alternate embodiment wherein the computer is included in the feedback loop will now be discussed with reference to FIG. 12D. Computer 251 packs together a combination of one bits and zero bits in the internal A-register, wherein each packed bit corresponds to a different segment 1210-1217 of scanner 1200 and wherein a one state may define transmissivity and a zero state may control reflectivity for the corresponding segments 1210-1217. Such operations may be performed with well-known table lookup and packing operations. Computer 251 may then output the packed discrete word from the A-register to the interface C-register 1207, wherein the packed discrete conditions B0-B7 are stored in C-register 1207 to control segments 1210-1217 of scanner 1200. Computer 251 packs together and outputs a new control word B0-B7 to C-register 1207 for every scan increment such as for each desired change in transmissivity and reflectivity of one or more segments 1210-1217; which may be sequential changes implemented with well-known counting, polling, and/or indexing programming methods. Incident illumination 102 is conditionally transmitted or chopped by scanner 1200 to generate chopped illumination 106 to illuminate sensor 134. Sensor output signal 114 may be sensed directly by computer 251 such as with a skip-on-discrete instruction. Computer 251 may either sequentially scan, randomly scan, or adaptively scan illumination 102 by monitoring feedback signal 114 to identify the direction or other characteristics of incident illumination 102. Therefore, computer 251 in the scanning loop may reduce special purpose electronics and may provide flexibility and adaptive control. A preferred embodiment of such a computer is discussed in application Ser. No. 101,881; where the preferred embodiment includes a read only memory and a scratch pad memory in a micro-computer type configuration.

For simplicity of discussion, illumination signals between element 1224 and scanner 1222 are shown at different angles indicated by signal paths 1240-1247. These signals 1240-1247 inbetween scanner 1222 and generator 1224 may actually be colinear, parallel, or have other such relationships.

A scanner embodiment may be used for display purposes, wherein this scanner inventive feature will now be discussed with reference to FIG. 12B. In this embodiment, element 1223 may be a multi-character display and may be a frosted glass screen or other projection device and element 1224 may be a character generator such as a single liquid crystal character being controlled from well-known digital display electronics. Refresh electronics such as discussed in applications Ser. No. 101,881 and Ser. No. 288,247 may be used to display a sequence of characters with character generator 1224. The sequence of characters may be scanned onto element 1223 into sequential locations shown being illuminated by illumination signals 1240-1247. For example, time-shared character generator 1224 may be controlled to repetitively generate a set of eight sequential characters wherein sets of these eight characters may be continuously and repetitively refreshed or generated. As each character is sequentially generated, a related illumination amplifier 1230-1237 may be controlled to project the related character onto element 1223 in the desired position. In a preferred embodiment, each sequential character of the set generated with generator 1224 corresponds to a different scanner element 1230-1237 and therefore a different projection location identified with illumination signals 1240-1247; wherein character generator 1224 and scanner segments 1230-1237 may be correspondingly controlled in the sequential character generation and scanning process. For example, a first character of the set may be generated in combination with the first scanned segment 1230 being selected to project the first character in the set onto the location of project screen 1223 defined by illumination signal 1240. Correspondingly, as each of the set of eight characters is sequentially generated with generator 1224, one of the scanner segments 1230-1237 is selected for the corresponding character. This can be seen with reference to the scan table discussed above, wherein each sequential scan signal B0-B7 may select a different control signal or character to be projected along the appropriate illumination signal path of signal paths 1240-1247 respectively. During the repetitive scan cycle, the B0 control signal or character will always be projected with illumination signal 1240 as controlled with the scan mechanization discussed above relative to FIGS. 12C and 12D. Therefore, scanner 1220 of the present invention may be used to time share a single-character display to provide a multiple-character display; thereby providing a low-cost and efficient multiple-character display.

Display generator 1224 may be a very small display generator such as a miniature liquid crystal display character and operator display 1223 may be a large display such as an audience display. Proper introduction of well-known optics such as magnifying lenses inbetween display generator 1224 and scanner 1222 or inbetween scanner 1222 and screen 1223 may permit use of a small character generator 1224 and a large screen 1223.

Another feature of the present invention illuminates generator 1224 with a high intensity floodlight 1225, where this floodlight is shown illuminating generator 1224 in a transmissive mode but similarly may be used in a reflective mood. High intensity illumination of a small generator 1224 may be used in combination with magnification optics such as magnifying lenses placed inbetween generator 1224 and projection screen 1223 to provide high intensity large screen displays with a miniature character generator 1224 using low power electrical control signals to control or modulate high intensity illumination from floodlight 1225 in an illumination amplifier configuration. Further, generator 1224 may generate other symbols than characters such as a spot of light, a schematic symbol, or other such symbols. In such an embodiment, system 1220 may be used as a photo-plotter or display, wherein element 1223 may be an illumination sensitive medium such as film for permanent recordings, may be a frosted glass screen or a frosted coating for temporary displays, or may be other types of illumination sensitive or projection devices.

Scanners 1200 and 1220 are discussed above as single-dimension scanners for simplicity of illustration. It is herein intended that the teachings discussed with reference to FIG. 12 be interpreted as exemplifying multi-dimensional scanning capability. For example, the angular representations of elements 1230-1237 shown in a single-dimensional configuration may be similarly shown in a multi-dimensional configuration for scanning illumination signals in a plurality of dimensions. For example, linear screen 1223 may be replaced with a two-dimensional screen such as used in a television receiver and the signals may be scanned in various well-known patterns such as a raster scan used in a conventional TV receiver. Alternately, other well-known scans may be used such as radar related scans identified as Palmer scans, A-scans, and B-scans.

Other applications and other embodiments of illumination chopper arrangements will now become obvious to those skilled in the art from the teachings of this invention and from prior art control arrangements used in conjunction with mechanical chopper arrangements.

Illumination Modulators

The various arrangements described in application Ser. No. 366,714 for controlling illumination permits modulation of illumination for communication of information. The illumination amplifier arrangement shown in FIG. 1 may be used to modulate illumination signals for communication of information. Prior art systems modulate illumination by controlling the source such as with optical couplers using electrical signals for controlling a Light Emitting Diode (LED) source and such as with mechanical modulators used in Navy communication devices to flash digital signals between ships. The illumination amplifier arrangement of the present invention permits modulation of illumination signals for communication of information such as modulating source illumination 102 with amplifier 104 to provide modulated illumination 106; where receiver 112 may include a photocell in an optical coupler arrangement or other receiver or the receiver may be an operator visually monitoring modulated optical signals.

Digital modulation of illumination can be provided with logic arrangements as illustrated in FIG. 2A with gates 210 and flip-flops 200 and 213. In addition, well-known digital arrangements may be used to generate pulse code modulation, pulse width modulation, and other digital modulation arrangements. Signals 214 may be used to control illumination amplifiers to digitally modulate illumination signals. Further, a pulse width modulation arrangement is discussed with references to FIGS. 2B-2D in application Ser. No. 366,714 to provide pulse width control for illumination amplifier devices. Further, as discussed in application Ser. No. 366,714; an analog amplitude control can be provided for illumination amplifiers that are responsive to analog amplitude signals for controlling illumination in response thereto.

Well-known optical coupler arrangements use a LED source and a photocell sensor to provide electrical isolation. In an improved arrangement, illumination amplifier 104 inbetween source 100 and photosensor 134 controls illumination 102 to be modulated under control of signal 133 to transmit illumination 106 conveying the desired information to photosensor 134.

Because of the solid-state characteristics of many source devices such as LEDs and the batch fabricated solid-state characteristics of illumination amplifier 104 and photosensor 134, a batch fabricated coupling arrangement can be provided. As an example, a monolithic array of source elements 100 may be provided using well-known integrated circuit technology and may be provided in combination with illumination amplifier devices in a batch fabricated configuration to control source illumination 102 with amplifier 104. The monolithic structure associated with solid-state source elements such as LEDs is typically a semi-conductor wafer and may be passivated with well-known techniques such as silicon dioxide. Illumination amplifiers may be constructed using glass substrates such as glass substrates for liquid crystal devices, where the silicon dioxide passivation provides an illumination amplifier substrate for combining source 100 and amplifier 104 structures in monolithic form. Further, well-known monolithic processes for producing photosensors 134 are also compatible with illumination amplifier technology. Therefore, illumination amplifier 104 may be configured in a batch fabricated monolithic form in conjunction with source 100, or photosensor 134, or both source 100 and photosensor 134.

As a further example, LEDs are packaged as individual components with a batch fabricated lens as part of the incapsulation package. Incorporation of illumination amplifiers as part of the lens structure or as part of the monolithic structure associated with source 100 provides a batch fabricated illumination element that is controllable with the very low levels of electric power.

Camera System Improvements

The camera system of the present invention is discussed in detail in application Ser. No. 366,714; particularly with reference to FIGS. 8-10 therein. Additional improvements are discussed hereinafter.

The camera system of the present invention provides a solid-state arrangement for controlling illumination. This is contrasted to prior art arrangements such as the well-known polaroid cameras which use electro-mechanical arrangements such as motors, mechanical shutters, and mechanical apertures for controlling illumination. The solid-state illumination control arrangements of the present invention provide advantages such as low cost, high reliability, low power, extensive flexibility, and others, and further permits batch fabrication.

One embodiment of an aperture arrangement will now be discussed with reference to FIG. 8C. Aperture 820C includes concentric segments 826C, 828C, and 830C. Only three segments will be illustrated for simplicity to exemplify the present invention. In a first embodiment; aperture segments 826C, 828C, and 830C may be controlled to be either transmissive or reflective for three aperture conditions; where segment 830C is controlled to be transmissive and segments 828C and 826C are controlled to be reflective for a first condition, segments 830C and 828C are controlled to be transmissive and segment 826C is controlled to be reflective for a second condition, and all segments 830C, 828C, and 826C are controlled to be transmissive for a third condition. In a second embodiment; aperture segments 830C, 828C, and 826C may all be controlled to be reflective or may all be controlled to be transmissive in various combinations such as segments 826C, 828C, and 830C may have one and only one segment transmissive, may have any pair of segments transmissive, or may have all segments transmissive for seven aperture states. In a third embodiment; segments 826C, 828C, and 830C may be controlled in analog fashion to be partially or totally reflective and/or transmissive to provide a virtually unlimited combination of aperture conditions.

In many applications, it may be preferred to concentrate illumination transmission (or reflection) in a particular portion of the illumination amplifier. For example, a lens introduces greater errors such as distortion at the outer periphery, wherein it is desired to concentrate illumination transmission near the center of the lens. Therefore, in a preferred embodiment of a shutter control in accordance with the present invention, it may be desirable to control shutter 820C to minimize transmissivity of the outer segments. For example, segment 830C may be controlled to become transmissive in analog fashion until it is completely transmissive before the next segment 828C is controlled to be even partially transmissive. When segment 830C becomes fully transmissive, segment 828C will then be controlled to become transmissive, and similarly when segment 828C becomes fully transmissive, segment 826C will then be controlled to become transmissive; thereby maximizing the reflectivity of the outermost segments and relying on control with the innermost segments until they become "saturated" or otherwise limiting.

In one control embodiment, an illumination servo arrangement as described in application Ser. No. 366,714 may be used to control aperture 820C to generate an illumination control signal related to a difference between the desired and the actual illumination transmitted through aperture 820C. A threshold detector would be used to control each of segments 828C and 826C; wherein an error signal below a first threshold would control only segment 830C, an error signal greater than the first threshold but less than a second threshold would be used to control segment 828C with segment 830C being fully transmissive due to the large error signal and an error signal greater than the second threshold would be used to control segment 826C with segments 828C and 830C being fully transmissive due to the large error signal. Such multi-segment control is similar to the use of multi-speed resolver control used in servo systems. In such systems, the one-out-of-three resolvers for control is selected based upon the error signal magnitude and threshold considerations. This well-known multi-speed resolver control concept can be used to provide the multi-segment control for the electro-optical resolver as discussed above.

A method for implementing electro-optical shutter and aperture arrangements will now be discussed for a lens and a liquid crystal device. Aperture and shutter arrangement 820C may be composed of liquid crystal material contained between lens elements having electrodes corresponding to segments 826C, 828C, and 830C provided thereon. Common prior art lens arrangements have combinations of concave and convex surfaces and provide precise mating therebetween. The inter-lens gap or space between lens elements may be filled with liquid crystal material therein and electrodes may be plated on the lens surfaces to provide batch fabricated lens, aperture, and shutter arrangements. One batch fabricated embodiment is illustrated in FIG. 4 of application Ser. No. 366,714. In a preferred embodiment, inter-element gap 436 may have curved surfaces and devices 434, 402, 403, and 435 may be shaped in the form of concave lenses, convex lenses, or various combinations of concave and convex lenses to provide mating therebetween and to provide inter-lens gaps such as gap 436. Gap 436 may be filled with liquid crystal material which may have electrodes thereon to control the transmissivity and reflectivity of the lenses for shutter control, aperture control, filter control, and combinations thereof. The shaping of elements such as elements 434, 402, 403, and 435 into lenses is well known in the optical art such as with lens grinding methods.

Batch fabricated devices 434 and 402 may be lens devices with mating surfaces being concave and convex respectively and having gap 436 filled with liquid crystal material and having electrodes formed on such lens surfaces. In one embodiment, the concave and convex lens may be constructed so that they do not match perfectly but provide a void at interface 436 when placed in contact therebetween. Therefore, gap 436 containing liquid crystal material may be formed as a natural gap by the mating of devices 434 and 402.

Movie Camera System

In accordance with still another feature of the present invention, an electronic control system is provided for a movie camera embodiment of the photographic camera system described herein and described in application Ser. No. 366,714 having illumination amplifier devices for control of movie film exposure. This movie camera system is illustrative of the more general features of the present invention which may be applied to other illumination system arrangements for exposure of an illumination sensitive medium with dynamic exposure operations such as multiple exposures synchronized with film motion as in a movie camera system.

Movie cameras are in wide use, where prior art movie camera controls are implemented with mechanical aperture, shutter, and control arrangements. Mechanical devices provide for film motion and for control of a shutter using sprocket drives and mechanical devices to provide synchronization therebetween. An improved arrangement will be discussed for controlling illumination of the film and providing synchronization between the film and the shutter with electronic devices.

A movie camera control arrangement will now be described with reference to FIG. 1. An illumination sensitive medium 130 such as movie film may be exposed with illumination 108 controlled by illumination amplifier 104. Amplifier 104 controls illumination in response to control signals 133. Input illumination may be natural illumination or may be artificial illumination, where artificial illumination may be generated with source 100 which may be excited with signal 132 or may be excited with raw excitation. Command device 127 and command signal processor 128 may be arrangements discussed in application Ser. No. 366,714 and, in a preferred embodiment, may be stored program digital computer 251 which may have integrated circuit memory arrangements as further discussed in application Ser. No. 101,881. Film 130 may be transported past illumination 108 such as with well-known sprocket drives or other known drive arrangements. Input illumination may be controlled by amplifier 104 to expose film 130 when amplifier 104 is transmissive and not to expose film 130 when amplifier 104 is reflective as described in application Ser. No. 366,714 for an illumination amplifier shutter. Control of amplifier 104 to be sequentially transmissive and reflective has been described in application Ser. No. 366,714 under Flasher Control which may be used to flash illumination 104 to expose film 130 by controlling amplifier 104 with signals 133.

Synchronization of exposures and film motion may be provided with prior art mechanical or electrical arrangements. In one embodiment, synchronization may be provided electronically, where electronic signals 133 are used to control illumination amplifiers 104 in synchronization with motion of film 130. Transducers for generating electrical signals in response to mechanical motion are well known in the art. In one embodiment, a switch arrangement may be controlled with a cam for opening and closing a switch in response to the rotation of a film sprocket wheel, where the switch may provide feedback signals to command devices 127 or command signal processor 128 to synchronize control of amplifiers 104 for generating flashing illumination 106 with signals 133. In another embodiment, a feedback signal may be used to control the command device 127 or signal processor 128; which may include computer 251, flip-flops 200 or 213, or other command devices. For example, the above-mentioned sprocket synchronized switch may generate a pulse at the start of exposure and a pulse at the completion of exposure for clocking flip-flop 213 to provide shutter signal 214A to control amplifier 104 to be sequentially reflective and transmissive. Switch signal processing circuits such as for switch debounce are well known in the art. In still another embodiment, photocell 134 may sense illumination being chopped by mechanical motion of the film drive arrangement to generate output signals 114 and feedback signals 120, 124, and 139 to synchronize flasher operation. Further, synchronization of print hammer actuation with position of a rotating print drum is similar to synchronization of electro-optical shutter operations with a rotating film sprocket drive; wherein such print devices are well known and are exemplified by the line printer products of Data Products Corporation of Woodland Hills, Calif.; and wherein the implementation thereof may be used for the exposure control of the present invention. Other control arrangements will now become obvious to those skilled in the art.

A detailed description of a photographic camera is presented in application Ser. No. 366,714 with reference to FIGS. 9A-9C, where the arrangements provided therein for the generalized photographic camera may also be used for a movie camera embodiment.

Computer Control Arrangement

A preferred illumination control embodiment uses computer 251 (FIGS. 2C and 9B) for generating command signals 126 to control source 100 with signal 132 generating controlled illumination 102 or to control amplifier 104 with signal 133 generating controlled illumination 106 or combinations thereof. Particular advantages are achieved by controlling amplifier 104 directly from computer 251 when computer 251 is a monolithic data processor as described in detail in the referenced copending applications, particularly in application Ser. No. 101,881. Such a monolithic data processor is low in cost and small in size, but provides output signals that can be used to directly excite illumination amplifiers of large size and having complex arrays of segments; where output signals from such a monolithic data processor implemented with processes such as MOS-FET integrated circuits have sufficient voltage and power levels to directly excite illumination amplifiers. In one embodiment, flip-flops 200 and 213 (FIG. 2A) may be controlled by generating clocks 208 and 215 respectively with discrete output instructions from computer 251 such as described in detail in the referenced applications. As further described in the referenced applications, toggling of flip-flops such as flip-flops 200 and 213 may be performed with a duty cycle related to a desired illumination parameter, thereby providing pulse width modulated signals on lines 204 and 212A to control illumination amplifiers in an analog fashion with signals 214 and 220, as described in application Ser. No. 366,714. In an alternate arrangement, pulse width modulated signals and phase related signals may be provided directly from a stored program digital computer such as computer 251 as described in application Ser. No. 366,714 under Analog Excitation and in the other referenced applications.

Traffic Light Control

As discussed in application Ser. No. 366,714; illumination amplifiers may be used to provide an improved traffic light system. Illumination amplifier 104 may be used to control illumination 102 from source 100 to provide output illumination 106, which may be colored illumination 668-670 or 676 as described for color illumination control illumination 650. Traffic light command and control signals 126, 132 and 133 may be provided with command device 127 and command signal processor 128 respectively. In a preferred embodiment, devices 127 and 128 include a stored program digital computer of the general purpose variety such as computer 251 (FIGS. 2C and 9B), where a preferred embodiment of computer 251 is described herein under Computer Control Arrangement.

In a preferred embodiment, computer 251 may be a monolithic computer and may include an integrated circuit memory such as an integrated circuit read only memory for program storage or an integrated circuit alterable memory for intermediate parameter storage or both a read only memory and an alterable memory. The combination of such an integrated circuit or monolithic computer and illumination amplifier devices are further described in application Ser. No. 366,714.

In an alternate embodiment, devices 127 and 128 may include special purpose arrangements.

Control of traffic lights can be provided using various illumination amplifier arrangements described herein and in application Ser. No. 366,714. As an example, amplifiers 104 may be controlled with signals 133 for flashing as described in application Ser. No. 366,714; where a flashing arrangement provides for attracting the attention of motorists associated with a change in traffic light color, a traffic warning, or other such purpose. As another example, traffic lights may be controlled in intensity as discussed in application Ser. No. 366,714 for the Dimmer Control; where a dimmer control may have a photocell transducer for sensing external illumination 140 such as sunlight or headlights or for sensing source illumination 106 to maintain constant illumination or, in a servo arrangement, for sensing controlled illumination 106. As yet another example, a combination of colors may be provided as discussed in application Ser. No. 366,714 to provide various shades and intensities of color for greater flexibility in traffic control.

Operator Panel

The teachings of the present invention may be exemplified with an operator panel to provide interaction between an operator and a system. A preferred embodiment of an operator panel is described in detail in application Ser. No. 101,881 and in continuation-in-part derived therefrom. Illumination amplifier devices described herein may be used in the operator panel of that application, where features such as the flat plane configuration, discrete illumination device, light pen arrangement, illuminated switch, color control, lamp control, dimmer control and flasher control described in application Ser. No. 366,714 may be used in the operator panel of application Ser. No. 101,881.

In another embodiment, the teachings of this invention may be applied to the dashboard of a vehicle such as an automobile; where an automobile dashboard will be described herein to exempify the operator panel features of the present invention. Further, the teachings of the present invention are equally applicable to other panels for operator interaction as exemplified by the dashboard of the following description.

Operator panels in the prior art may have illumination intensity controls such as a panel light dimmer control in prior art automobiles. Such an arrangement embodies a potentiometer for reducing excitation to the illumination source such as dashboard bulbs for source illumination control. Use of illumination amplifier display elements in accordance with the present invention permits intensity to be controlled electronically using an illumination amplifier such as with excitation signal 133 to amplifier 104, using only low power and providing other advantages over source illumination control as discussed in application Ser. No. 366,714.

Flashing display elements consistent with the flasher control feature of the present invention (discussed in application Ser. No. 366,714) improves operator interaction by rapidly drawing attention to the flashing indicator.

Colored displays provide improved human-factor considerations that are well known in the art. The color control features of the present invention can be implemented as colored display elements to enhance operator interaction. Further, a colored display that provides a color that changes in intensity, hue, or other characteristic as a function of a controlling parameter will enhance operator interaction. For example, a display of engine temperature or oil pressure that varies from green through red as a function of the temperature parameter or pressure parameter respectively will provide an analog indication of the controlling parameter, where the colored display enhances human-factor considerations. Further, a velocity display may be provided that changes color with the vehicle velocity. Such colored displays may change color either continuously or as a function of transition through a threshold condition and may also provide a flashing display which may be a flashing colored display when a particular condition such as a warning condition of high temperature, low pressure, or high speed is encountered.

A display of a plurality of characters such as numeric characters or alpha-numeric characters as discussed in application Ser. No. 101,881 may be provided in the dashboard of the present invention. Such character displays may be the segment displays of application Ser. No. 101,881 and may be refreshable displays controlled in the manner described in that application. Such character displays may provide a digital readout of operating conditions such as a digital display of velocity in place of or in addition to the conventional analog speedometer display and may further be a switchable display such as described in application Ser. No. 101,881, where a plurality of operating parameters may be displayed such as selected by the operator with a selector switch.

In a preferred embodiment, a computer such as described in application Ser. No. 101,881 controls the vehicle and the dashboard in the same manner described for the numerical control system of application Ser. No. 101,881 for controlling a machine. As discussed in application Ser. No. 101,881 for manual data input in the keyboard mode, the vehicle dashboard of the present invention permits an operator to provide various input controls such as velocity, acceleration and deceleration ramps, vehicle path of travel, and control of various vehicle operations such as described in application Ser. No. 291,394.

The audionic clock of application Ser. No. 325,933 may be provided with the system of the present application for display of time information with the above-disclosed character display to provide time information. Such a clock embodiment may be inherent in the system of this invention, where the computer has inherent capability to provide time information and the display for such time information may already be available on the operator panel with the character display.

It will become obvious from the teachings herein that the computer system arrangement described in the copending patent applications is equally applicable to the control of an automobile as it is to control of machine tools described therein. The control of direction, velocity, machine operations, and interaction with an operator described for a machine control system is directly applicable to the control of a vehicle such as an automobile and machine control arrangements described therein are intended to be applied to an automobile herein.

The Discrete Illumination Device described in application Ser. No. 366,714 may be used for displaying the vehicular conditions associated with the automobile dashboard of the present invention.

The audionic system of application Ser. No. 325,933 provides a preferred embodiment of operator interaction for control of a vehicle such as an automobile and in a preferred embodiment is used in combination with the control and display arrangement for the automobile dashboard.

Improved Side Projector

Another feature of the present invention provides an arrangement to blank out the objectionable illumination pulse introduced when changing slides in a slide projector. Prior art slide projectors such as the Kodak Carousel 35 mm slide projector have illumination masks for static slide projection so that only illumination transmitted through the slide is projected on the screen, thereby eliminating other light paths which could project distracting high intensity illumination. Unfortunately, during slide change operations, high intensity projection illumination is permitted to leak into the projection opt... and is projected on the screen. This high intensity leakage illumination is distracting and disturbing to an audience during slide change operations.

In accordance with the instant inventive features slide projector illumination may be blanked-out during slide change operations to prevent projection of high intensity illumination during slide changing. Illumination blanking may be achieved by turning off the lamp, by introducing a mechanical shutter, or by introducing an electro-optical shutter.

In a preferred embodiment, the electro-optical shutter of the present invention may be used to blank slide changing leakage illumination. Well-known slide projectors receive a slide change signal such as from a remote slide change switch closure. This slide change signal can also be used to turn off the lamp or activate the shutter. In one embodiment, the slide change switch may be a well-known multiple-pole switch wherein the extra switch pole may be used to perform the blanking function such as with lamp turn-off or with shutter activation. Alternately, the slide change mechanism internal to the slide projector may include a switch to control the blanking operation during the slide change operation of the mechanism. Many other blanking control arrangements will become obvious from the teachings herein.

In an alternate embodiment, a mechanical shutter arrangement may be constructed as part of the slide change mechanism wherein the slide change mechanism may include opaque shutter portions that minimize illumination leakage into the projection optics.

It has been found that the above-discussed slide change illumination pulse is disturbing to an audience because of the high intensity compared with normal slide viewing and that a lower intensity slide change pulse would reduce such disturbance. Therefore, the slide change blanking operation need not provide total illumination blanking but may provide merely reduction in illumination intensity such as with a partially transmissive shutter or a partially de-energized lamp.

Segment Arrays

Illumination control has been described herein relative to illumination amplifier areas having desired shapes. In one embodiment of illumination control devices in accordance with the present invention, illumination amplifier devices are arranged having an array of miniature segments 1300 (FIG. 13) which will herein be described as micro-segments over an area, where illumination control characteristics of that area may be defined as a sum or an integral of the effects of a multitude of micro-segments controlled individually or as groups of micro-segments. In one embodiment, the micro-segments may be similar to the dot patterns associated with the printing art and known as screened or half-tone arrays of dots. It is well known to those skilled in the printing art that an array of dots in a screened configuration provides an image having the combined effect of a plurality of the dots in a particular area to provide shades of grey or shades of color for the printing process. In a manner analogous to the use of screened printing concepts, an array of micro-segments can be controlled to transmit and reflect illumination; wherein the characteristics of the controlled illumination 108 is related to the combined effects of multitudes of micro-segments in a particular area 1300.

In one embodiment, control of illumination intensity or color or both may be provided with a plurality of sets of micro-segments wherein the illumination amplifier device contains micro-segments from each set interspersed together. For simplicity of discussion, two sets of interspersed micro-segments will be considered. It may further be assumed that a first set of micro-segments 1310 shown shaded covers one-third of the illumination amplifier area 1300 and a second set of micro-segments 1312 shown non-shaded covers the other two-thirds of the illumination amplifier area. When both sets 1310 and 1312 are controlled to be transmissive, all of illumination 102 will be transmitted as illumination 108 and no illumination will be reflected as illumination 110. Similarly, when the first set is excited to be transmissive and the second set is excited to be reflective, one-third of illumination 102 will be transmitted as illumination 108 and two-thirds of illumination 102 will be reflected as illumination 110. When both sets are excited to be reflective, substantially all illumination 102 will be reflected as illumination 110. Therefore, two sets of interspersed micro-segments may be used to provide four states of illumination from full transmissivity to full reflectivity. Further, a larger number of sets of micro-segments can be provided to control the transmitted and reflected illumination, where digital control of sets of micro-segments can provide variations in transmitted and reflected illumination intensity. Therefore, a form of analog control of illumination intensity can be provided by digital control of a plurality of sets of micro-segments. Still further, the micro-segments may have different shapes and different dimensions and sets of micro-segments may be related to different densities such as with different size micro-segments and different quantities of micro-segments, where the embodiment described above can be implemented having the second set of micro-segments providing twice the density either with twice as many of the same size micro-segments or with the same quantities of micro-segments being twice as large as those of the first set or other combinations of size and quantity. Further, micro-segment size and quantity may be determined and may be intermixed in combinations and arrangements to meet the special requirements of the particular application.

From the above discussion, it can be seen that the net effect of an illumination amplifier arrangement may be controlled to provide variations in intensity, in color, or in other characteristics using only digital control of micro-segments. Further, micro-segments can also be controlled with analog excitation to provide additional flexibility for illumination control. Still further, micro-segments can be provided having different color characteristics such as described for color control in application Ser. No. 366,714 to provide color patterns such as is well known in the printing field with color screened type printing techniques.

Yet further, arrays of micro-segments or individual micro-segments can be selected with coincident select excitation to provide the desired illumination control. Such an arrangement may be used for a display such as discussed herein and in application Ser. No. 366,714 for the Operator Panel and the Audience Display System or may be used for arrangements such as for a television receiver. Color television receivers are well known in the art having dot patterns of colored phosphor arranged on a screen and selected with an electron beam scanning the phosphor pattern. A solid state television display may be provided with micro-segments of illumination amplifier devices either individually selectable with a linear select arrangement or, for greater economy, selectable with a multiple dimensional select arrangement such as a two dimensional or coincidence selection arrangement. In such a television display system, arrays of micro-segments may comprise a set of three micro-segments each having a different color such as with phosphorous segments on a color television tube and using the color control concepts described in application Ser. No. 366,714 under Color Control and applied to the micro-segment configuration. Therefore, individual control of each of three colored micro-segments associated with each set of micro-segments may provide the intensity of the three primary colors, thereby yielding the equivalent of a spot having a color related to the combination of the intensities of the three colors of that set of micro-segments as described in application Ser. No. 366,714 under Audience Display System. Still further, sequential selection of each set of three micro-segments will provide the equivalent of the roster scan associated with well-known color television sets.

The above-mentioned display system having sets of micro-segments may be used for black and white television sets, color television sets, and general display systems such as described in application Ser. No. 366,714 under Audience Display System.

Multiple Electrode Logic

The present invention has been described for simplicity using a pair of electrodes providing an electric field therebetween. One feature of this invention provides a plurality of electrodes which may be a quantity greater than two electrodes each having a different control signal for excitation for providing greater control flexibility. For simplicity, this arrangement having a plurality of control signals will be described as summation of electrostatic fields such as with a liquid crystal device. It is herein intended that such an arrangement exemplify more generalized inventive features wherein a plurality of electrodes each have a different control signal and that at least one return electrode be provided as may be required for control of the illumination amplifier from said plurality of electrical control signals.

One embodiment of the multiple control feature of the present invention will be described with respect to FIG. 8B, where a plurality of electrodes 826, 827, and 830 are provided on one side of the electro-optical material in conjunction with a common electrode on the opposite side of the illumination amplifier material, wherein the electrostatic field between control electrodes 826, 828, and 830 and the common electrode may be defined with well-known electrostatic theory such as described in the textbook Electromagnetic Fields and Waves by Ramo and Whinnery. Any number of control electrodes may be provided wherein the combination of excitation fields, the magnitudes of excitation fields, and other such characteristics define the total excitation field for controlling the illumination amplifier material such as the liquid crystal material. The net effect of a plurality of signals and fields is related to the summation of the excitation signals, the geometry of the electrodes, the geometry of the illumination amplifier structure, and other such considerations that can be analyzed and designed with such well-known electrical field theory.

The plurality of electrodes illustrated in FIG. 8B is merely exemplary of the general features of the present invention, where the electrodes may be shaped, positioned, and oriented therebetween to provide the desired field pattern and where said plurality of electrodes may be square electrodes within square electrodes as illustrated in FIG. 8B, concentric circular electrodes as illustrated in FIG. 8C, geometric patterns of electrodes as illustrated in FIG. 8A, electrode patterns as illustrated in FIG. 11, micro-segment electrodes interspersed therebetween as described with reference to FIG. 13 and other patterns of electrodes to provide the desired fields for excitation.

In one embodiment, a pair of electrodes may be interspersed so that the field pattern of either electrode can excite the liquid crystal material to be reflective and the absence of excitation from both electrodes will render the liquid crystal material to be transmissive. This arrangement is equivalent to a logical OR gate, where excitation by either one or by both electrodes will control the amplifier to be reflective and where excitation on neither electrode will control the amplifier to be transmissive. In a complement form, a logical AND gate may be provided with complement-excitation (non-excitation) on both electrodes to provide transmissivity, but the absence of complement-excitation (non-excitation) on either electrode will provide reflectivity.

In yet another embodiment, the two control electrodes may have inverse excitation such as positive and negative DC fields or in-phase and out-of-phase AC excitation; where excitation on a first control electrode may provide reflectivity, excitation on neither electrode may provide transmissivity, and excitation on both electrodes may provide a cancellation effect equivalent to the non-excitation state thereby providing transmissivity; thereby providing an A·B logical operation.

The above-described arrangement may use analog excitation. In one such embodiment, excitation from a plurality of electrodes may be summed either in combinations of inverted and non-inverted forms to provide addition and subtraction with addition and subtraction of fields respectively based upon the related excitation magnitudes. Various types of analog excitations such as analog amplitude excitation, pulse modulated excitation, combinations of analog amplitude and pulse modulated excitation, and other such forms of excitation may be provided for the plurality of control electrodes feature of the present invention.

Control, arithmetic, logical, and other operations may be provided such as with the geometry of the electrodes, the inter-relation of the electrodes, and other such design parameters. For example, a first electrode may be provided for primary excitation and a second electrode may be provided having a geometric relationship with said first electrode to provide fringe fields that are a function of the geometry of the electrode relationships, wherein the effect of the second electrode may provide a non-linear control, mathematical, or digital relationship. Such non-linear relationships may be logarithmic, exponential, geometric, and other desired functions of excitation.

A still further feature of the present invention may provide a greater number of electrodes such as 3 electrodes, 4 electrodes, or 5 electrodes to provide combinations of the operations described above. In one example, digital excitation for a first electrode may provide an enable and disable control operation, bias excitation for a second electrode may provide bias control related to a predetermined level, a third electrode may be excited with a mathematical control function, a fourth electrode may be excited with a non-linear function, and additional electrodes may be used to perform other such functions.

Fringe Control

The electric fields and waves art such as described in the textbook Electromagnetic Fields and Waves by Ramo and Whinnery show that the fields outside of the electrode area may provide a fringe field affect. Particular advantage may be achieved with fringe fields when used with liquid crystal devices, exemplary of a general inventive feature having electrodes offset therebetween to provide fringe fields therebetween for excitation of liquid crystal material to exemplify this inventive feature.

A simplified description of the fringe control inventive feature will now be provided with reference to FIG. 11. For simplicity of discussion, it will be assumed that each segment 1142–1145 and 1152–1155 has a corresponding electrode thereunder; colocated, similarly shaped and designated with an A symbol. For example, segment 1144 is assumed to be located directly above and on the other side of the controlled liquid crystal material of a corresponding similarly shaped electrode 1144A. Excitation of electrode 1144 and return electrode 1144A directly thereunder provides a controllable segment shaped as segment 1144. Excitation of segment 1145 and return segment 1145A directly thereunder provides a controllable segment shaped as segment 1145 and further provides a fringe pattern being most intense at the transition between segments 1144 and 1145 and may vary in intensity such as from the center of arrangement 1140 outward to the right therefrom. Similarly, intensity may decrease in relation to the distance from the intersection of segments 1144 and 1145 and may vary as a function of the distance from the center of arrangement 1140. One analysis of the intensity may be made from well-known field theory, where the intensity of the field may control intensity of the reflectivity or transmissivity of the illumination amplifier device.

From the above description, it can be seen that complex patterns of intensities can be provided by excitation and return electrode shapes and positions therebetween. Further excitation of a plurality of electrodes such as electrodes 1142-1145 and 1152-1155 and having corresponding return electrodes 1142A-1145A and 1152A-1155A thereunder can selectively provide complex field arrangements therebetween for providing different geometric patterns and intensities of illumination amplifier action.

The term fringe arrangement is herein intended to mean control of illumination amplifier devices having offset, or non-orthognal, or skewed, or other such relationships and in particular offset electrodes for providing non-perpendicular electrostatic fields therebetween for controlling illumination amplifier devices.

Still further, such offset arrangements may be partially offset, where segments 1144A and 1145A together may define a return electrode and segments 1144 and 1145 together may define an excitation electrode; where segment 1144 thereby defines the common area or superimposed area of return electrode 1144A and 1145A and excitation electrodes 1144 and 1145 and segments 1145 and 1154 thereby define offset portions of the electrodes such as for fringe effects. In one embodiment, common segment 1144 may be larger than segments 1145 and 1154 and therefore segment 1144 may provide the primary illumination control with fringe segments 1145 and 1154 providing only secondary illumination control such as edge or fringe effects, possibly for a soft glow area around the edge of display segments. In still other embodiments, fringe segments 1145 and 1154 may be larger than segment 1144 and therefore segments 1145 and 1154 may provide the primary illumination control.

Integrated Electro-Optic Devices

Many features of the present invention are directed to batch-fabricated or integrated illumination processing devices. For example, a batch fabricated (or integrated) illumination processor is discussed in application Ser. No. 366,714 with reference to FIG. 4. Because illumination amplifier technology such as using liquid crystal material is associated with an illumination transmission medium such as glass, a high degree of integration can be achieved. For example, the inter-lens interface between a plurality of lens elements in a compound lens device is an ideal environment for introducing a liquid crystal aperture, shutter, modulator, and/or other liquid crystal illumination processing devices. Such integrated or batch fabricated implementation is particularly meaningful in the presence of the general industrial belief that such integration is ultimately possible but is not presently practical. This is demonstrated in the article Integrated Electronics: 1973-1975 by Cunningham in the June 1975 issue of Electro-Optical Systems Design. For example, fiber optic transmission mediums provide excellent structure for liquid crystal devices as discussed herein. As discussed herein for glass-type transmission medium, many optical processing devices similar to glass can provide ideal structure for liquid crystal devices. For example, many optical processing devices are made of semiconductor material such as germanium and silicon. These materials are very similar to glass and therefore can provide an excellent structure for liquid crystal devices similar to the well-known use of glass. For example, liquid crystal material can be provided inbetween silicon wafers or silicon dice and liquid crystal electrodes can be provided on the silicon surfaces with well-known photochemical techniques as used in the manufacture of integrated circuits. Therefore, important advantages can be achieved by using electro-optical materials in combination with semiconductor materials.

In one embodiment, liquid crystal material may be used in conjunction with a silicon die for selectively illuminating silicon areas such as for photo-diode and photo-transistor control. The photo-diodes and photo-transistors can be readily implemented on the silicon die with well-known photo-lithographic integrated circuit techniques and the metalized electrodes can be implemented with well-known deposition and etching techniques to provide a batch fabricated or integrated electro-optical device and sensor device. This example can be better understood with reference to FIG. 4, where element 435 may be a transmission or processing medium such as glass, element 404 may be a photo-detector array such as having silicon photo-transistors 426, and liquid crystal material may be provided in the inter-device gap 422 with well-known techniques as if devices 435 and 404 were conventional glass substrates for liquid crystal displays. Illumination sensed by photo-detectors 426 may be controlled with the illumination amplifiers in gap 422 or with the other batch fabricated illumination amplifiers described with reference to FIG. 4 such as amplifier 476. Illumination may be controlled with illumination amplifiers using the digital and analog processing techniques discussed with reference to FIG. 3. Further, the second substrate 435 may be other than a mere illumination transmission substrate but may be a batch fabricated illumination source such as having a plurality of light emitting diodes (LEDs). This would provide a batch fabricated system having illumination sources, controls, and detectors; wherein substrate 435 may provide illumination sources such as LEDs, gap 422 may provide illumination amplifier control such as with liquid crystal material, and substrate 404 may provide illumination sensors 426 all in a batch fabricated or integrated form.

Particular advantage can be achieved by using illumination amplifier devices such as liquid crystals in conjunction with semiconductor or monolithic source devices and sensor devices and particularly in a batch fabricated arrangement. For example, many source devices such as light-emitting diodes and electro-luminescent devices and many sensors such as photo-transistors, photoresistors, and photocells are constructed with monolithic processes and may be protected with passivation techniques sometimes known as glassivation, as discussed in the textbook Integrated Circuits by Warner and Fordemwalt. Passivation consists of a substrate coating placed over the monolithic components for protection and may be usable as a substrate for an illumination amplifier device. The passivation coating may be processed such as with grinding, depositing, etching, etc. to form liquid crystal substrates and may have another substrate placed in conjunction therewith with liquid crystal material placed therebetween.

Batch fabricated components may consist of illumination source 100 or illumination receiver 112 or both source 100 and receiver 112 constructed in conjunction with amplifier 104; where the source may generate transmitted illumination 102 being incident upon amplifier 104 on the same substrate or illumination 102 may be incident from external sources onto amplifier 104 for control of illumination 106 being incident upon receiver 112 in the monolithic structure. Still further, source 100 and receiver 112 may both be constructed on the monolithic device in conjunction with amplifier 104 where source illumination 102 may be incident upon amplifier 104 on the surface and reflected to receiver 112 on the same substrate as reflected illumination 106.

The batch fabricated nature of the combined structure such as a semiconductor and liquid crystal device will now be described with reference to FIG. 4. Sensor 404 may have one or more elements 426 and may have a passivation coating on surface at gap 422 for protection. Another substrate 435 may be placed in conjunction with sensors 404 and the space therebetween 422 may be constructed with metalized electrodes and filled with illumination amplifier material. The surfaces of devices 435 and 404 may be processed with deposition and etching methods to selectively form conductors. In another configuration, device 434 may be a source device such as having light-emitting diodes constructed therein and having surface mated with substrate 402 which may be a passivated surface and providing interface 436 which may be constructed with electrodes and being filled with illumination amplifier material such as liquid crystal material. Although surfaces at interfaces 436 and 422 may be shown in irregular form, grinding and other such processes may be used to provide the desired interface surface geometry such as with lens curvatures. In one embodiment, source and transducer elements may be constructed on the same substrate and having an illumination amplifier constructed on the surface thereof.

Further, particular advantages can be obtained by using an illumination amplifier in conjunction with a light-emitting diode (LED) or with a phototransistor or other such semiconductor source and sensor devices. Still further advantage can be obtained by providing this combination as a batch fabricated combination.

Further, many other devices permit illumination emplifier and optical device integration. For example, various types of modulators such as crystal modulators are used in conjunction with shutters, apertures, and mirrors for controlling and modulating illumination. The use of electro-optical illumination amplifier devices such as liquid crystal devices in conjunction with such crystal modulators such as a Pockel cell permit the combined functions of high frequency modulation and low frequency shutter and aperture control to be achieved. The implementation of the liquid crystal material in combination with the modulator device is similar to that discussed herein for integration of liquid crystal material with lenses, illumination sources, detectors, and processors such as with reference to FIG. 4.

Still further, the illumination amplifier may be integrated with other optical devices such as prisms, ceramic substrates, etc. as discussed for integration with lenses and other such devices in application Ser. No. 366,714.

Particular advantages may be achieved by using batch fabricated photo sensor arrays such as array 404 with elements 426 shown in FIG. 4. One such array is manufactured by RCA for use in vidicon camera tubes, which arrays and camera tubes are applicable as discussed in application Ser. No. 366,714 for photo sensors such as with reference to array 404 of FIG. 4. Such devices are provided by the RCA Corporation, Camera Tube Division, Lancaster, Pa. such as vidicon tube model nos. 4532, 4804, and 4833.

Another embodiment of the illumination amplifier feature of the present invention utilizes an illumination amplifier for photocell control in a batch fabricated configuration. Photocells have wide applicability for direct conversion of solar energy into electrical energy. Illumination control in conjunction with photocells such as for controlling natural illumination such as sunlight illuminating a photocell can be performed with illumination amplifier techniques such as with liquid crystal devices. The batch fabricated embodiments discussed with reference to FIG. 4 provide a preferred embodiment thereof. Further, the control of sunlight incident on water discussed with reference to FIG. 7D is also applicable to the control of illumination incident on photocells. In the photocell embodiment, the compatibility between the photocell array and the liquid crystal substrate permit a batch fabricated liquid crystal and photocell configuration to be implemented, thereby providing further advantages.

Improved Fiber Optic Arrangement

The use of illumination amplifier inventive features in combination with fiber optic devices provides further advantages. Fiber optic devices may be implanted for example as strands of glass for transmitting illumination. The placement of illumination amplifier material in inter-strand gaps or other locations with well-known methods permits electronic control of transmitted illumination. In one embodiment discussed with reference to FIG. 4, element 434 may be a first fiber optic strand portion and element 402 may be a second fiber optic strand portion which may be connected with an inter-strand gap 436 wherein illumination may be transmitted through strand 434, through gap 436, and then through strand 402. Placement of an illumination amplifier in inter-strand gap 436 permits electronic control of transmitted illumination. Although FIG. 4 has previously been used to exemplify a batch-fabricated illumination processor, the inter-medium gap technique is equally applicable to fiber optic devices and other devices. For example, FIG. 4 shows angular surfaces such as surface 432 for reflection of controlled illumination, but the inter-medium gap 436 may be implemented with square surfaces, curved surfaces, or other surfaces to facilitate the desired effect. For example, in the fiber optic control arrangement discussed below, gap 436 may be flat and may be square with the axes of the fiber optic strand or alternately gap 436 may be curved with concentric-type matching curves on mating elements 434 and 402.

Fiber optics may be considered to be illumination conductors analageous to electronic conductors. The illumination computer elements described with reference to FIGS. 3 and 4 implement illumination circuits analageous to electronic circuits. Similarly, fiber optic conductors may provide illumination signals, analageous to electrical wires performing as electrical conductors. Further, illumination amplifier digital and analog computational elements discussed with reference to FIGS. 3 and 4 provide computational functions analageous to electronic integrated circuits and other electronic circuit elements. For example, the illumination signals shown in FIG. 3 may be conducted with fiber optic illumination conductors for more precise control of illumination signal routing.

Additional Considerations

The arrangements and methods described herein and in application Ser. No. 366,714 are useful individually and in combinations and further may be used in many new and unique applications either individually or in combinations to provide improvements in prior art equipment and methods. Some of these new and unique applications are described hereinafter exemplary of the broad range of applicability of the features of the present invention. It is intended that these specific applications discussed hereinafter be exemplary of the very broad applicability of the features of the present invention.

The system of this invention is discussed relative to photo-electric devices such as the well-known liquid crystal devices. Many of the applications described herein may be described in terms of the "illumination amplifier" concept and embodiment. It is herein intended that the scope of this invention be broadly interpreted and be applicable to a wide range of electro-optical, electro-chemical, and other such devices for controlling illumination that may be used to provide the capabilities described herein which are exemplified with liquid crystal devices.

Further advantages may be achieved by using the features of the instant illumination amplifier invention in combination with a coherent illumination source such as a laser. The combination of a plurality of illumination signals such as a plurality of coherent signals may also be combined with non-coherent signals and may be processed with the illumination amplifier inventive features. For example, the multiple illumination signals shown in FIG. 5 may be combinations of coherent and non-coherent signals. In various embodiments signals 510, 520, and 522 may all be coherent laser-type signals, may all be non-coherent signals, or may be combinations of coherent and non-coherent signals such as signals 510 and 520 being coherent and signal 522 being non-coherent or conversely signals 510 and 520 being non-coherent and signal 522 being coherent.

The use of illumination amplifiers in combination with lasers provides important advantages, wherein laser systems often utilize beam splitters, mirrors, and transmitters. The electronically controllable reflectivity, transmissivity, absorbtivity, and other characteristics of illumination amplifiers permits convenient electronic control of laser illumination. Control of the reflectivity and transmissivity of an illumination amplifier is discussed with reference to FIG. 3 where for example amplifier 340 may be an electronically controllable beam splitter which is controlled with electronic signal D providing transmitted signal 342 and reflected signal 343 from incident signal 341.

Another feature of the present invention is the use of illumination amplifiers in combination with surface acoustic wave (SAW) devices. SAW devices are well known in the art and are exemplified with a piezo-electric crystal that generates and propogates acoustic surface waves in response to electrical excitation. A combined acoustical and optical arrangement provides particular advantages. For example, the integration of an SAW device and an electro-optical device such as a liquid crystal device can be used to provide combinations of capabilities. This can be exemplified by placement of a liquid crystal device on the surface of an SAW device such as with well-known electrode deposition on an SAW device which is then covered with a glass substrate and filling with liquid crystal material to provide an integrated LCD and SAW. This may be seen with reference to FIG. 4 where element 434 may be the SAW device, gap 436 may be filled with liquid crystal material, and substrate 402 may be a glass substrate or may be a portion of the batch fabricated illumination computer discussed with reference to FIG. 4 in application Ser. No. 366,714. Surface acoustic waves propogating over the surface of SAW device 434 can modulate the illumination reflected therefrom such as illumination 460 and 466 to provide reflected illumination modulated with the acoustic wave information. Many other embodiments and uses will now become obvious from the teachings herein.

Time sharing of excitation devices is enhanced by providing memory elements with illumination amplifier devices, where memory elements such as flip-flops and capacitors can be provided to store excitation signals for illumination amplifiers. Memory elements may be refreshed or updated with excitation electronics 127 and 128 using refresh methods provided in application Ser. No. 288,247. The excitation electronics need not continuously excite illumination amplifier devices 104 having memory devices contained therewith. Time shared excitation devices may be defined as devices that excite an illumination amplifier for a limited period of time, then terminate the excitation of that particular illumination amplifier element to provide excitation for another illumination amplifier element. Capacitor devices may be provided as batch fabricated devices, where illumination amplifier substrates may provide capacitive effects that may be sufficient for exciting the illumination amplifier devices. In another embodiment, capacitors may be formed with thin and thick film techniques and constructed as part of the illumination amplifier structure or may be constructed as separate components mounted on the illumination amplifier structure to provide the batch fabricated arrangements.

An illuminated switch arrangement will be described hereinafter using a capacitor memory to store a switch display condition. Such a memory arrangement is exemplary of the broad teachings of the present invention, where the capacitor memory arrangement may be used in conjunction with illumination amplifier devices in other applications. In general, time sharing of command devices and command signal processors 127 and 128 between a plurality of illumination amplifier devices is enhanced with memory devices such as a capacitor for signal storage. Other memory devices such as flip-flops may also be used in conjunction with illumination amplifier devices. In a preferred embodiment, a batch fabricated illumination amplifier and memory arrangement provides further advantages such as low cost, small size, and greater performance.

Modern integrated circuit technology is based upon monolithic elements of low power capabilities communicating in the monolithic domain with other low power devices. Typically, external components require complex interface drivers to amplify low power levels of the monolithic devices to drive interface lines and to control higher powered external devices which may be discrete elements such as light emitting diodes, display tubes, and other such components. The availability of a low power illumination control device such as the illumination amplifier arrangement described herein provides direct drive capability from the low power monolithic elements to low power illumination amplifier elements which can operate directly from monolithic circuit output signal levels.

One application of the low power capability of illumination amplifier devices is an automobile which may use monolithic digital devices such as the monolithic computer described in application Ser. No. 101,881 which may be implemented with well-known CMOS integrated circuit techniques for low power consumption and controlling many illumination signals within a vehicle. Such a monolithic computer can be used to control brake lights, flashing turn signals, dash lights, head lights, and other illumination devices in the vehicle using illumination amplifiers directly operable from the output signals of the monolithic computer. In such an application the monolithic computer may receive a plurality of input signals and control the illumination amplifiers in response thereto. A turn signal control such as a switch may be interrogated by such a computer, where the computer may generate command signals to a turn signal related illumination amplifier to control flashing thereof. Alternately, a brake control such as a switch may also be interrogated by such a monolithic computer, where the computer may generate command signals to a brake light related illumination amplifier in response to the brake command signal. Further, headlight control may be implemented with low level command signals from a monolithic computer controlling headlight illumination amplifier devices.

Still further, electronically controllable illumination amplifiers may be used in combination with various coatings such as dielectric coatings, ceramic coatings, and other coatings to provide further advantages in the combination thereof which advantages are well known in the art. Although certain types of illumination may tend to degrade optical coatings and illumination amplifiers. This degradation can be minimized using well-known chemical methods or by using low energy illumination. Although degradation is a consideration, degradation need not be a major limitation as indicated by material degradation in important technologies such as cathode degradation in the vacuum tube technology. Therefore, degradation characteristics are herein noted merely for completeness. Optical coatings and characteristics are discussed in the article Dielectric Cavity Laser YAG Efficiency by Hahn and Hahn in Electro-Optical Systems Design magazine dated February 1975 herein incorporated-by-reference.

In another embodiment, an illumination dimmer may be implemented as a pair of sunglasses constructed with illumination amplifier eye-pieces. The low power requirements of many types of illumination amplifiers will permit a small battery and excitation device to be provided in a portable configuration which may include an operator control such as a potentiometer for operator adjustment to provide the desired dimming characteristics. The illumination dimmer embodiment is discussed in application Ser. No. 366,714.

Color control arrangements are discussed in application Ser. No. 366,714. Still another arrangement may be implemented by using illumination amplifier material such as liquid crystal material having a particular spectral characteristic such as by adding color elements to liquid crystal material or providing a liquid crystal material having a self-contained or inherent color characteristic. Yet another arrangement provides a substrate with a particular spectral response such as a colored glass substrate used in combination with a liquid crystal device.

Photographic arrangements are discussed in application Ser. No. 366,714. In one embodiment, control of exposure in response to artificial illumination such as for flash phothography may be provided in an adaptive manner with the photographic camera system of this invention. As shown in FIG. 1, illumination 102 from source 100 is controlled by signal 132; where source 100 may be a well-known photographic flash device. Illumination receiver 134, which may be a photocell responsive to illumination from source 100, generates feedback signals 114 provided as feedback signals 120, 124, or 139 which may be used to control source 100 with signals 132 and to control amplifier 104 with signals 133 to provide desired source illumination 102 and exposure illumination 106. These feedback control signals may be used to minimize required source energy such as from a battery by de-energizing source 100 when sufficient illumination has been provided as detected with transducer 134. Further, control of amplifier 104 may be used to control the precise amount of illumination that is exposing film 130 as discussed in detail in application Ser. No. 366,714.

Pertinence Of Material Incorporated-By-Reference

The instant application (as with the parent application Ser. No. 366,714) incorporates-by-reference co-pending applications and patents that contribute to the disclosure of the present invention. The pertinence thereof will now be discussed.

The pertinence of copending application Ser. No. 101,881 will now be discussed.

FIG. 1 of application Ser. No. 101,881 sets forth a data processor 12 for controlling machine 24 with servos 20-22 and discrete control signals 26 and with operator panels 14 and 18. Control of machine 24 with servos and discrete controls is similar to control of the illumination amplifiers of the present invention with servos and discrete control devices. For example, the machine control servos are disclosed using pulse-modulated methods similar to the methods discussed in the instant application. Further, discrete signals can also be used for controlling illumination amplifiers and for providing computer feedback from illumination amplifiers. Still further, the discrete and alpha-numeric displays of display panel 18 can use the illumination amplifier arrangements of the instant application and control panel 14 can use the illuminated switches of the present invention, thereby further describing the usage environment of the illumination amplifier displays.

FIG. 2 of application Ser. No. 101,881 sets forth the detailed operator control and display panel environment for usage and operation of the illumination amplifier devices of the present application. In particular, FIGS. 2C and 2D provide the interface between a monolithic computer and an operator panel which can incorporate the illumination amplifier features of the present invention. Further, this computer interface is exemplary of more general uses discussed in the instant application for control of illumination amplifiers with a digital computer.

FIGS. 3 and 16-19 of application Ser. No. 101,881 exemplifies a servo control with a computer interface, wherein the computer-commanded servo control is usable with the illumination amplifier devices of the present invention in substitution for machine tool 24 of the embodiment discussed in application Ser. No. 101,881.

FIGS. 5-12 of application Ser. No. 101,881 sets forth architecture of one embodiment of a monolithic computer exemplary of the more generalized computer usable with the illumination amplifier features of the instant invention.

FIG. 13 of application Ser. No. 101,881 exemplifies input and output control between a computer and external devices which may be the illumination amplifier devices of the present invention. For example, discrete inputs DI-0 to DI-11 may be used to monitor discrete states such as sensor signals that monitor controlled illumination. Discrete outputs $\overline{DO-1}$ to $\overline{DO-11}$ may be used to control illumination amplifier devices such as by exciting the illumination amplifier either with a static DC output level set into a flip-flop such as by toggling flip-flops I1 to I4 with discrete outputs $\overline{DO-8}$, $\overline{DO-4}$, $\overline{DO-5}$, and $\overline{DO-6}$ respectively; or by directly pulsing the illumination amplifier device such as with a pulse rate modulated signal; or otherwise controlling illumination amplifiers through well-known interface electronics under discrete output control. Whole word outputs OW-0 to OW-11 may be used to generate whole number commands such as with packed discretes to the lamps discussed with reference to OW-11 outputs, or to numeric displays discussed with reference to OW-9 outputs, or with analog magnitude information to a digital-to-analog converter which is exemplified with the disclosure set forth in copending application Ser. No. 325,933 discussed hereinafter. Latched discretes and control signals are shown generated with the OW-8 signal loading C-register 260 and generating the C6Q to C15Q signals. Input word signals IW-0 to IW-7 are shown loading feedback information into the computer such as packed discretes from sensors; whole number digital signals from an analog-to-digital converter such as disclosed in application Ser. No. 325,933 discussed hereinafter; or other computer input signals.

FIGS. 14A and 14B of application Ser. No. 101,881 further exemplify computer inputs such as loading packed signals T0-T8, P0-P3, M0-M2, J0-J2, and S0-S11 into the computer and also exemplify the output of packed control signals from Z-register 268 with storage flip-flops Z0-Z11.

FIG. 15 of application Ser. No. 101,881 discloses packed output control signals TS-0 to TS-7 and encoded input signals S0-S3 and others.

FIGS. 16-19 of application Ser. No. 101,881 discloses a servo arrangement that is exemplary of servos that may be used for illumination control in place of the machine control.

The pertinence of applications Ser. No. 134,958 and Ser. No. 135,040 will now be discussed. These applications are directed to servo control of a machine with a computer, wherein the machine servo control is also exemplary of an illumination amplifier servo control. This control is disclosed using hardwired servo loops commanded by a computer in an open-loop fashion and also in an alternate embodiment with the computer being in the servo loop. Further, pulse modulated control under computer program control is disclosed wherein the computer may be in the servo loop directly exciting the control device which may be an illumination amplifier and by directly monitoring the feedback device which may be an illumination sensor.

The pertinence of copending application Ser. No. 288,247 will now be discussed. In particular, application Ser. No. 288,247 is directed to interaction between the operator panel and the computer of the above-discussed application Ser. No. 101,881; wherein the computer flow diagrams of FIGS. 3 and 5-7 of application Ser. No. 288,247 disclose the processing and communication implemented with the hardware diagrams of FIGS. 1, 2, 8, and 9 corresponding to related figures of application Ser. No. 101,881 as discussed above.

The pertinence of copending application Ser. No. 291,394 will now be discussed. This application is directed to control of a machine by a computer using discrete signals which is exemplary of control of the illumination amplifier arrangements of the present invention with a computer using discrete signals. FIGS. 1, 2, and 4-6 of application Ser. No. 291,394 are similar to related figures of application Ser. No. 101,881 but application Ser. No. 291,394 provides more detailed disclosure relative to discrete control. In application Ser. No. 291,394; FIG. 7 provides a more detailed disclosure of a discrete input and output interface for the computer and FIG. 8 provides program control disclosures relative to controlling of external devices; exemplary of control of illumination amplifier devices with discrete signals.

The pertinence of application Ser. No. 302,771 will now be discussed. This application is also directed to control of a machine with various control methods including servos and adaptive control; exemplary of control of illumination devices in accordance with the present invention. FIGS. 1, 2, and 4A of application Ser. No. 302,771 are similar to related figures in application Ser. No. 101,881 as discussed above. FIGS. 3 and 4B of application Ser. No. 302,771 are exemplary of control arrangements applicable to the illumination control devices of the instant application. FIGS. 6 and 8 of application Ser. No. 302,771 are exemplary of signal processing for control of devices and are directly usable with illumination devices. FIGS. 7 and 10 of application Ser. No. 302,771 are exemplary of computer operations for control of devices such as the illumination devices of the present invention.

The pertinence of copending application Ser. No. 325,933 will now be discussed. Although this application is directed to audio response, many of the audio control functions are exemplary of illumination control functions. FIGS. 1and 2 of application Ser. No. 325,933 are similar to related figs. of copending application Ser. No. 101,881 discussed above and are discussed in greater detail in application Ser. No. 325,933. FIG. 3 of application Ser. No. 325,933 sets forth a detailed analog-to-digital converter, digital-to-analog converter, and computer input/output structure usable in combination with the computer operations of FIG. 6 and are exemplary of generalized converter input/output operations usable with the illumination devices of the present invention. FIG. 5 of application Ser. No. 325,933 is exemplary of generalized computer operations of controlling external devices which may be the illumination devices of the present invention.

The pertinence of copending application Ser. No. 550,231 will now be discussed. This application is directed to filtering, signal processing, communications, and memory systems which may be implemented with illumination devices disclosed in the instant application. For example, analog and digital illumination computing devices disclosed with reference to FIG. 3 of the instant application may be used to implement the devices of application Ser. No. 550,231 such as disclosed in FIGS. 4, 6, and 7 therein. Further, the illumination devices of the instant application may be usable in combination with or in replacement of the CCD devices of application Ser. No. 550,231 as set forth in FIG. b 9 1 therein.

In view of the above, the disclosures of the referenced copending applications herein incorporated-by-reference exemplify arrangements and methods that are usable with the illumination devices of the present invention and are intended to be usable in combination therewith. For example, the servo control arrangements disclosed in said copending applications are intended to be used in replacement for the servo control arrangements disclosed in the instant application and are in general intended to be usable in combination with the illumination control devices of the instant application. Further, the computer control and interaction disclosed in said copending applications is intended to be usable in combination with the illumination control devices of the present invention where for example the computer 251 disclosed in FIGS. 2 and 9 of the instant application is intended to be supplemented with the computer disclosure of said copending applications.

SCOPE AND DEFINITIONS

The invention disclosed herein is presented in preferred embodiments of illumination control arrangements to exemplify the inventive features, but the scope of this invention is much broader than illustrated with these preferred embodiments. Therefore, the scope is intended to be broadly interpreted to cover the general fields of illumination control.

Various publications may be used for providing background for this invention and for illustrating the prior art. The various subject areas and associated references for each subject area are listed below.

(1) Integrated circuit technology is described in the book *Integrated Circuits* by Raymond M. Warner, Jr. and James N. Fordemwalt (Editors) for McGraw-Hill Book Company (1965).

(2) Digital computer technology is described in the books
   (a) *Digital Computer Design* by Edward L. Braun for Academic Press (1963) and
   (b) *Digital Computer Design Fundamentals* by Yao-han Chu for McGraw Hill (1962).

(3) Digital computer programming is described in the books
   (a) *Programming: An Introduction to Computer Languages and Techniques* by Ward Douglas Maurer for Holden Day Inc. (1968),
   (b) *Programming for Digital Computers* by Joachim Jeenel for McGraw Hill (1959), and
   (c) *Elements of Computer Programming* by Swallow and Price for Holt, Rinehart, and Winston (1965).

(4) Analog computer technology is described in the book *Methods for Solving Engineering Problems Using Analog Computers* by Leon Levine for McGraw Hill (1964).

(5) Servo technology is described in the book *Automatic Control Systems* by Benjamin C. Kuo for Prentice-Hall (1962).

(6) Illumination technology is described in the books
   (a) *Optics, A Course For Engineers and Scientists* by Charles Williams and Orville Becklund for John Wiley and Sons Inc,
   (b) *Optical Data Processing* by Arnold Roy Shulman for John Wiley and Sons Inc, and
   (c) *Optics* by Bruno Rossi for Addison-Wesley (1957).

(7) Integrated circuits are described in the book *The TTL Data Book for Design Engineers* from Texas Instruments Incorporated.

Various elements of the present invention have been described herein separately for simplicity. In a preferred embodiment, various elements of the present invention may be used in combination to provide the combined advantages of the individual elements. These combinations will become obvious to those skilled in the art from the teachings of this invention. As an example the combination of the aperture size device 820 (FIG. 8B), aperture rotational device 800 (FIG. 8A), and shutter device 838 (FIG. 8D) can be provided by combinations of the patterns described for each independent arrangement.

Illumination processing arrangements may be shown to illustrate individual features and may not repeat description of other arrangements that are described herein or that will become obvious to those skilled in the art from the teachings of this invention. For example; aperture, shutter, and control arrangements are individually discussed in detail herein but may not be repeated for each specific description. It is intended that such aperture, shutter, and control arrangements be useable with other arrangements described herein such as the illumination computer. In general, it is intended that all individual features of this invention be useable in combination with all other individual features of this invention.

Inventive features that may be used in combination include open loop or closed loop excitation, digital or analog excitation, aperture and shutter devices, and other such features. Further, such combinations may not be individually distinguishable where, for example, the aperture and shutter devices may be integrated together by making all aperture segments 826–830 (FIG. 8B) reflective to provide shutter capability.

For the various embodiments discussed herein, the illumination amplifier may be an integral part of an illumination source such as a glass enclosure of a bulb, an intermediate device placed inbetween a source and a receiver, or other such arrangement.

Illumination is herein intended to be interpreted in broad form and is intended to mean generalized illumination including light, both visible and non-visible, electron beams, generalized electromagnetic radiation including microwaves, and other forms of illumination. Illumination is intended to further include natural light from the sun, generated light such as from a light bulb, coherent light such as from a laser, and non-visible light such as infra-red and ultra-violet illumination. Illumination may herein be referred to as illumination signals and illumination beams to describe directed illumination. Illumination may have a broad spectrum or a narrow spectrum. Well known illumination processing devices such as filters may be used to selectively provide illumination of a desired spectral characteristic.

The term illumination as used herein may mean a particular characteristic of an illumination signal such as intensity, intensity of a particular spectral region, or other illumination characteristic.

An illumination source is herein intended to be interpreted in broad form and may include a single source or a plurality of sources, a light bulb source for visible light, a laser or maser source for coherent illumination, the sun as a source of natural sunlight, and other sources of illunination.

A preferred embodiment of an illumination amplifier is discussed herein as a variable transmissivity or reflectivity device such as the well known liquid crystal devices. Terms used herein such as illumination control device or illumination amplifier are intended to include such a variable transmissivity or reflectivity device, but is also intended to include other illumination control devices such as variable absorption and variable filtering devices.

Illumination processing devices are well known to those skilled in the art. Different types of illumination may require different types of processing devices. For example lenses, prisms, mirrors, filters, shutters, and apertures may be used for visible illumination; magnetic and electric fields may be used for electron beams; and other well known devices may be used for other types of illumination. These illumination processing devices perform functions such as collimating, focusing, blocking, shaping, and filtering illumination. Because these illumination processing devices and their use are well known, such devices may not be described herein unless necessary to further illustrate operation.

Illumination may be imaged, collimated, focused or otherwise processed with illumination processing devices. An image may be used to illuminate or to expose an illumination sensitive medium such as film for recording the image such as by exposing or otherwise affecting the medium.

An illumination amplifier such as a liquid crystal device that converts between reflective and transmissive characteristics can be provided in complement illumination arrangements. Complement illumination arrangements will be illustrated with reference to FIG. 3A, where source illumination is directed to illumination amplifier 300 which may be a liquid crystal amplifier. The transmissive characteristic of amplifier 300 permits transmitted illumination 302 to be transmitted through amplifier 300 to illumination receiver 303. The reflective characteristic of amplifier 300 permits reflected illumination 304 to be reflected from amplifier 300 to illumination receiver 305. Assuming conservation of illumination and constant input illumination 301, as the reflectivity of 300 is increased, the transmissivity is decreased, and conversely. Therefore as transmitted illumination 302 is increased, reflected illumination is decreased, and conversely. A complement arrangement can be illustrated with a simple example, where it is desired to first fully illuminate, then to remove illumination from an illumination receiver. For this example, the receiver can be arranged as receiver 303, where amplifier 300 can be made transmissive for illuminating receiver 303 and then be made reflective for removing illumination from receiver 303. In a complement arrangement, the receiver can be arranged as receiver 305, where amplifier 300 can be made reflective for illuminating receiver 305 and then can be made transmissive for removing illumination from receiver 305. Because of the complementing characteristics of reflective-transmissive illumination amplifier devices, it will now become obvious that either of the complement arrangements may be used for implementing an illumination amplifier arrangement. For simplicity, only one of the complement forms is usually described herein. It is herein intended that either of the complement illumination amplifier forms be useable with an embodiment, even though an embodiment may only be described relative to one of such complement forms.

From the above description it will be apparent that there is thus provided a device of the character described possessing the particular features of advantage before enumerated as desirable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. An illumination control system comprising:
   an illumination source for generating source illumination;
   an illumination control device for generating controlled illumination by selectively transmitting source illumination in response to a control signal;
   sensor means for generating a sensor signal in response to the controlled illumination from said illumination control device; and
   a stored program digital computer for generating the control signal to said illumination control device in response to the sensor signal under control of a stored program.

2. The system as set forth in claim 1 above, wherein said sensor means includes means for generating the sensor signal in response to the source illumination.

3. The system as set forth in claim 1 above, wherein said computer includes pulse modulation means for generating a pulse modulation signal in response to the sensor signal and wherein said illumination control device includes means for generating the controlled illumination in response to the pulse modulation signal.

4. The system as set forth in claim 1 above, wherein said sensor means includes means for generating the sensor signal as a pulse width modulated sensor signal.

5. The system as set forth in claim 1 above, wherein said sensor means includes means for generating the sensor signal in response to the source illumination.

6. The system as set forth in claim 1 above, wherein said computer includes means for generating a control signal in response to the sensor signal and wherein said illumination source includes means for generating the source illumination in response to the control signal.

7. The system as set forth in claim 1 above, wherein said computer includes means for generating a control signal in response to the sensor signal and wherein said illumination control device includes means for reflecting the controlled illumination from said illumination control device toward said sensor means.

8. The system as set forth in claim 1 above, wherein said illumination control device includes a liquid crystal device for generating the controlled illumination in response to the source illumination under control of the control signal from said computer.

9. The system as set forth in claim 1 above, wherein said computer includes a pulse width modulation circuit for generating a pulse width control signal in response to the sensor signal and wherein said illumination source includes means for generating the source illumination in response to the pulse width control signal from said computer.

10. The system as set forth in claim 1 above, wherein said computer includes a pulse width modulation circuit for generating a pulse width control signal in response to the sensor signal and wherein said illumination control device includes means for generating the controlled illumination in response to the pulse width control signal from said computer.

11. The system as set forth in claim 1 above, wherein said computer includes a pulse rate modulation circuit for generating a pulse rate control signal in response to the sensor signal and wherein said illumination source includes means for generating the source illumination in response to the pulse rate control signal from said computer.

12. The system as set forth in claim 1 above, wherein said computer includes a pulse rate modulation circuit for generating a pulse rate control signal in response to the sensor signal and wherein said illumination control device includes means for generating the controlled illumination in response to the pulse rate control signal from said computer.

13. The system as set forth in claim 1 above, wherein said computer includes a pulse modulation circuit for generating a pulse signal in response to the sensor signal and wherein said illumination source includes means for generating the source illumination in response to the pulse signal from said computer.

14. The system as set forth in claim 1 above, wherein said illumination source generates the source illumination for illumination of a room, wherein said illumination control device includes a cholesteric liquid crystal device for transmitting the controlled illumination in response to the room illumination from said illumination source, wherein said sensor means include a photocell for generating the sensor signal in response to the controlled illumination, and wherein said computer includes a feedback circuit for generating a feedback signal in response to the sensor signal and a pulse width modulation circuit for generating a pulse width modulated signal in response to the feedback signal, wherein said illumination control device further includes means for generating the controlled illumination in response to the pulse width modulated signal from said computer.

15. The system as set forth in claim 1 above, wherein said computer includes:
a servo for generating the control signal as a pulse modulated servo control signal in response to the sensor signal;
wherein said illumination control device includes means for generating the controlled illumination in response to the source illumination under control of the pulse modulated servo control signal from said servo.

16. The system as set forth in claim 1 above, wherein said computer includes an implicit servo for generating an implicit servo feedback signal in response to the sensor signal, wherein said illumination control device includes means for generating the controlled illumination in response to the source illumination under control of the implicit servo feedback signal from said computer.

17. The system as set forth in claim 1 above, wherein said illumination source includes a plurality of illumination source elements for generating the source illumination, wherein said illumination control device includes means for generating the controlled illumination in response to the source illumination from said plurality of illumination source elements under control of the illumination control signal from said computer.

18. The system as set forth in claim 1 above, wherein said illumination source includes a plurality of illumination source elements for generating the source illumination in response to the illumination control signal from said computer.

19. The system as set forth in claim 1 above, further comprising an analog circuit for generating an analog circuit signal in response to the control signal from said computer and wherein said illumination source includes means for generating the source illumination in response to the analog control signal from said analog circuit.

20. The system as set forth in claim 1 above, further comprising an analog circuit for generating an analog circuit signal in response to the control signal from said computer and wherein said illumination control device includes means for generating the controlled illumination in response to the source illumination under control of the analog control signal from said analog circuit.

21. The system as set forth in claim 1 above, wherein said computer includes a duty cycle circuit for generating a duty cycle control signal in response to the sensor signal and wherein said illumination source includes means for generating the source illumination in response to the duty cycle control signal from said computer.

22. The system as set forth in claim 1 above, wherein said computer includes a duty cycle circuit for generating a duty cycle signal in response to the sensor signal and wherein said illumination control device includes means for generating the controlled illumination in response to the source illumination under control of the duty cycle signal from said computer.

23. The system as set forth in claim 1 above, further comprising:
a comparitor for generating a comparison signal in response to a comparison between the control signal from said computer and the sensor signal from said sensor means;
wherein said illumination control device includes means for generating the controlled illumination in response to the comparison signal from said comparison means.

24. The system as set forth in claim 1 above, further comprising a servo for controlling the source illumination in response to the sensor signal.

25. The system as set forth in claim 1 above, wherein said computer is a monolithic stored program digital computer for generating the control signal in response to the sensor signal under control of a program stored in an integrated circuit memory and wherein said illumination source includes means for generating the source illumination in response to the illumination control signal from said computer.

26. The system as set forth in claim 1 above, wherein said computer is a monolithic stored program digital computer for generating the control signal in response to the sensor signal under control of a program stored in an integrated circuit read only memory and wherein said illumination control device includes means for generating the controlled illumination in response to the source illumination under control of the control signal from said monolithic stored program digital computer.

27. The system as set forth in claim 1 above, further comprising an illumination servo for generating an illumination control signal in response to the sensor signal, wherein said illumination servo includes compensation means for controlling dynamic response to the illumination control signal, and wherein said illumination control device includes means for generating the controlled illumination in response to the illumination control signal from said servo.

28. The system as set forth in claim 1 above, wherein said stored program digital computer includes
   (a) an integrated circuit read only memory for storing a computer program,
   (b) an input circuit for receiving the sensor signal in response to the program stored in said read only memory,
   (c) processing logic for generating processed information under control of the program stored in said read only memory in response to the input signal received with said input circuit, and
   (d) an output circuit for generating an output signal in response to the information processed with said processing logic under control of the program stored in said read only memory;
wherein said illumination control device includes means for generating the controlled illumination in response to the output signal from said output circuit.

29. The system as set forth in claim 1 above, wherein said stored program digital computer includes
   (a) an integrated circuit read only memory for storing a computer program,
   (b) an input circuit for receiving the sensor signal in response to the program stored in said read only memory,
   (c) processing logic for generating processed information under control of the program stored in said read only memory in response to the input signal received with said input circuit, and
   (d) an output circuit for generating an output signal in response to the information processed with said processing logic under control of the program stored in said read only memory;
wherein said illumination source includes means for generating the source illumination in response to the output signal from said output circuit.

30. The system as set forth in claim 1 above, further comprising:
   an analog to digital converter for generating a digital sensor signal in response to an analog sensor signal from said sensor means; wherein said stored program digital computer includes means for generating the control signal as a digital control signal in response to the digital sensor signal from said analog to digital converter under control of a stored program; and
   a digital to analog converter for generating an analog control signal in response to the digital control signal from said computer;
   wherein said illumination control device includes means for generating the controlled illumination in response to the analog control signal from said digital to analog converter.

31. The system as set forth in claim 1 above, further comprising:
   an analog to digital converter for generating a digital sensor signal in response to an analog sensor signal from said sensor means; wherein said stored program digital computer includes means for generating the control signal as a digital control signal in response to the digital sensor signal from said analog to digital converter under control of a stored program; and
   a digital to analog converter for generating an analog control signal in response to the digital control signal from said computer;
   wherein said illumination source includes means for generating the source illumination in response to the analog control signal from said digital to analog converter.

32. The system as set forth in claim 1 above, wherein said computer includes
   (a) a computer main memory for storing a computer program,
   (b) an input circuit for receiving the sensor signal in response to the program stored in said memory,
   (c) processing logic for generating processed information in response to the input signal received with said input circuit under control of the program stored in said memory, and
   (d) an output circuit for generating the control signal as a pulse modulated control signal in response to the information processed with said processing logic under control of the program stored in said memory;
wherein said illumination control device includes means for generating the controlled illumination in response to the pulse modulated control signal from said output circuit.

33. The system as set forth in claim 1 above, wherein said computer includes
   (a) a computer main memory for storing a computer program,
   (b) an input circuit for receiving the sensor signal in response to the program stored in said memory,
   (c) processing logic for generating processed information in response to the input signal received with said input circuit under control of the program stored in said memory, and
   (d) an output circuit for generating the control signal as a pulse modulated control signal in response to the information processed with said processing logic under control of the program stored in said memory;
wherein said illumination source includes means for generating the source illumination in response to the pulse modulated control signal from said output circuit.

34. The system as set forth in claim 1 above, further comprising a mechanical switch for generating a switch signal and wherein said illumination control device includes means for generating the controlled illumination in response to the switch signal from said switch.

35. The system as set forth in claim 34 above, wherein said switch is a gravity switch and wherein the switch signal is generated in response to the orientation of said gravity switch.

* * * * *